(12) United States Patent
Palmer et al.

(10) Patent No.: US 8,941,430 B2
(45) Date of Patent: *Jan. 27, 2015

(54) TIMING CALIBRATION FOR ON-CHIP INTERCONNECT

(75) Inventors: Robert Palmer, Chapel Hill, NC (US); John W. Poulton, Chapel Hill, NC (US); Thomas Hastings Greer, III, Chapel Hill, NC (US); William James Dally, Stanford, CA (US)

(73) Assignee: NVIDIA Corporation, Santa Clara (CA)

(*) Notice: Subject to any disclaimer, the term of this patent is extended or adjusted under 35 U.S.C. 154(b) by 0 days.

This patent is subject to a terminal disclaimer.

(21) Appl. No.: 13/612,614

(22) Filed: Sep. 12, 2012

(65) Prior Publication Data

US 2014/0070862 A1   Mar. 13, 2014

(51) Int. Cl.
*H03H 11/26* (2006.01)

(52) U.S. Cl.
USPC ............................. 327/263; 716/134; 716/113

(58) Field of Classification Search
USPC ................................... 716/110, 111, 113, 134
See application file for complete search history.

(56) References Cited

U.S. PATENT DOCUMENTS

| | | | |
|---|---|---|---|
| 5,182,632 A * | 1/1993 | Bechtel et al. | 257/713 |
| 5,972,788 A * | 10/1999 | Ryan et al. | 438/634 |
| 6,378,109 B1 * | 4/2002 | Young et al. | 716/115 |
| 6,499,131 B1 * | 12/2002 | Savithri et al. | 716/115 |
| 6,507,247 B2 | 1/2003 | Langston | |
| 6,624,667 B2 | 9/2003 | Nii | |
| 7,519,888 B2 | 4/2009 | Tabatabaei et al. | |
| 7,583,209 B1 * | 9/2009 | Duan | 341/80 |
| 7,779,319 B1 | 8/2010 | Tabatabaei | |
| 7,882,471 B1 * | 2/2011 | Kariat et al. | 716/113 |

(Continued)

OTHER PUBLICATIONS

Palmer, R., U.S. Appl. No. 13/612,629, filed Sep. 12, 2012.
Poulton, J.W., U.S. Appl. No. 13/619,765, filed Sep. 14, 2012.

(Continued)

*Primary Examiner* — Ryan Jager
(74) *Attorney, Agent, or Firm* — Zilka-Kotab, PC

(57) ABSTRACT

One embodiment sets forth a timing calibration technique for on-chip source-synchronous, complementary metal-oxide-semiconductor (CMOS) repeater-based interconnect. Two transition patterns may be applied to calibrate the delay of an on-chip data or clock wire. Calibration logic is configured to apply the transition patterns and then trim the delays of the clock and data wires based on captured calibration patterns. The trimming adjusts the delay of the clock and data wires using a configurable delay circuit. Timing errors may be caused by crosstalk, power-supply-induced jitter (PSIJ), or wire delay variation due to transistor and wire metallization mismatch. Chip yields may be improved by reducing the occurrence of timing errors due to mismatched delays between different wires of an on-chip interconnect.

22 Claims, 18 Drawing Sheets

(56) References Cited

U.S. PATENT DOCUMENTS

| | | | |
|---|---|---|---|
| 8,144,792 B2* | 3/2012 | Ware et al. | 375/257 |
| 8,165,187 B2* | 4/2012 | Hampel et al. | 375/219 |
| 8,644,419 B2* | 2/2014 | Hampel et al. | 375/295 |
| 2002/0013672 A1* | 1/2002 | Higashide | 702/89 |
| 2003/0236107 A1* | 12/2003 | Azuma | 455/561 |
| 2005/0163203 A1* | 7/2005 | Ware et al. | 375/219 |
| 2006/0291574 A1* | 12/2006 | Ware et al. | 375/257 |
| 2011/0298522 A1* | 12/2011 | Ichikawa | 327/361 |
| 2012/0266009 A1* | 10/2012 | Momoi et al. | 713/401 |
| 2013/0230122 A1* | 9/2013 | Ware et al. | 375/295 |

OTHER PUBLICATIONS

Non-Final Office Action from U.S. Appl. No. 13/612,629, dated Jun. 24, 2013.

Notice of Allowance from U.S. Appl. No. 13/612,629, dated Nov. 18, 2013.

Non-Final Office Action from U.S. Appl. No. 13/619,765, dated Oct. 10, 2013.

Final Office Action from U.S. Appl. No. 13/619,765, dated Feb. 27, 2014.

* cited by examiner

TIMING CALIBRATION FOR ON-CHIP INTERCONNECT

BACKGROUND OF THE INVENTION

1. Field of the Invention

The present invention generally relates to timing calibration and, more specifically, to timing calibration for on-chip interconnect.

2. Description of the Related Art

A source-synchronous, complementary metal-oxide-semiconductor (CMOS)-repeater-based interconnect provides a simple, high-performance topology for global on-chip communication fabrics. However as silicon die sizes increase, the on-chip interconnect may span 10 mm or more in length, and the communication channels are subject to many sources of timing error, including crosstalk, power-supply-induced jitter (PSIJ), and wire delay variation, due to transistor and wire metallization mismatch.

For a 10-mm lower-level metal wire with 130 um width and space, 50% utilization on adjacent layers, and with repeater size and optimized for the minimum power-delay product, the 1-σ delay variation is about 8 ps per transition polarity per wire due to transistor variation (slow process, 0.75V, and 125 degrees Celsius). If a "lone 1" is transmitted across such a wire, the leading and trailing signal transitions may each exhibit independent timing offsets normally distributed about a mean delay with a σ8 ps. This is equivalent to 1-σ values of 2.3% duty-cycle distortion (DCD) for a 4-Gb/s toggle (or 2-GHz double-data-rate clock) and 5.7 ps skew (i.e. net delay offset in the central point between the two edges). An example on-chip network is composed of one hundred 10-mm channels, each 10 bytes wide and operating at 4 Gb/s per wire (i.e. delivering a total of 4 TB/s over 10-mm). Assuming crosstalk, PSIJ, and random jitter (extrapolated to the bit error rate of interest) amount to 0.44 UI (110 ps), and flip-flop tolerances and clock buffer skews amount to 0.2 UI (50 ps), a statistical timing budget predicts a yield of 0% for the assembly of links comprising the on-chip network due to wire delay mismatch. In other words, with a yield of 0% no chips including such an on-chip network would function properly at full speed.

Crosstalk mitigation methods developed for source-synchronous, CMOS-repeater-based interconnect topologies can limit resulting timing jitter to about 200 milli unit interval (mUI) at aggressive bandwidth densities (e.g. on the order of 30 Tb/s per mm of bus width at the 28-nm process node). Power supply noise on the order of +/−7% can result in significant modulation of data rate (through modulation of signal propagation velocity), further reducing the effective timing margin by as much as 400 mUI. In such harsh environments, wire delay mismatch can cause chips to fail to operate properly, as explained above regarding the transmission of the "lone 1", resulting in severe yield loss. The combination of wire delay mismatches, timing jitter, and power supply noise may reduce the effective timing margin such that clock frequency must be reduced to ensure that timing margin constraints are met so that the chip operates properly. In particular, the chips may fail when an on-chip source-synchronous, CMOS-repeater-based interconnect serves as the building block for large on-chip networks responsible for moving several terabytes of data per second across large portions of the chip. Failure of even a single signal transmitted on the wire of the interconnect to satisfy the timing margin constraints will likely result in a functional failure of the chip.

When power supply regulation schemes are employed to mitigate PSIJ and improve energy efficiency, gate overdrive may be decreased. The decreased gate overdrive exacerbates the delay mismatches between different wires of the source-synchronous, CMOS-repeater-based interconnect. Delay mismatch among the various wires in a given sub-channel of the on-chip interconnect results in DCD and clock-to-data skew, reducing the yield.

Accordingly, what is needed in the art is a timing calibration technique for on-chip source-synchronous, CMOS-repeater-based interconnect that mitigates wire delay mismatch and helps improve chip yields.

SUMMARY OF THE INVENTION

One embodiment of the present invention sets forth a timing calibration technique for on-chip source-synchronous, CMOS-repeater-based interconnect. Two transition patterns may be applied to calibrate the delay of an on-chip data or clock wire. Calibration logic is configured to apply the transition patterns and then trim the delays of the clock and data wires based on captured calibration patterns. The trimming adjusts the delay of the clock and data wires using a configurable delay circuit.

Various embodiments of the invention for calibrating an on-chip interconnect include applying a first signal transition pattern to a first wire of the on-chip interconnect to generate a plurality of first measurements. Based on the plurality of first measurements, a delay circuit is configured to adjust a delay of the first wire to fall within a range of a predetermined delay variation that is substantially centered on an edge of a clock signal.

One advantage of the disclosed timing calibration technique is that it may be used to reduce wire delay mismatches for on-chip interconnects, which, in turn, helps improve overall chip yields.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

A configurable delay circuit can be used to correct mismatches in delays between signals such as between clock signals and data and between different bits of data within a multi-bit data bus. Misaligned clock edges relative to data signals can result in functional errors, e.g., timing errors. The configurable delay circuit may be used to align the clock relative to the data signals and ensure that timing requirements are better met.

Mismatches in delays between different signals of a multi-bit data bus present challenges for meeting the timing requirements to correctly sample all signals of the multi-bit data bus. The mismatches are typically caused by varying wire lengths and variations due to the silicon fabrication process for the different data signals of the multi-bit data bus. In particular, the delays of different repeater elements that are inserted along the length of data and clock signal wires may vary, resulting in mismatches between the different data signals and between clock signals relative to the data signals. The configurable delay circuit may be used to minimize the variation between the valid sampling windows for each data signal of a multi-bit bus, thereby reducing functional errors.

Other potential sources of systematic skew between clock and data signals are asymmetry in the clock buffers at the transmitter and receiver ends of a link over which the data is transmitted, and aperture offsets in the receiver flip-flops. Adjustments of the forwarded clock phase can be made using the configurable delay circuit to compensate for such offsets. The ability to independently adjust the rising delay and falling delay provided by the configurable delay circuit allows for trimming of the data signals and for adjustment of a clock signal duty-cycle or pulse-width. Adjustment of the rising-edge timing should be essentially independent of the falling-edge timing. Otherwise, if the adjustments to each edge interact strongly, it is difficult to find a suitable tuning algorithm for removing timing offsets.

Figure 1A:
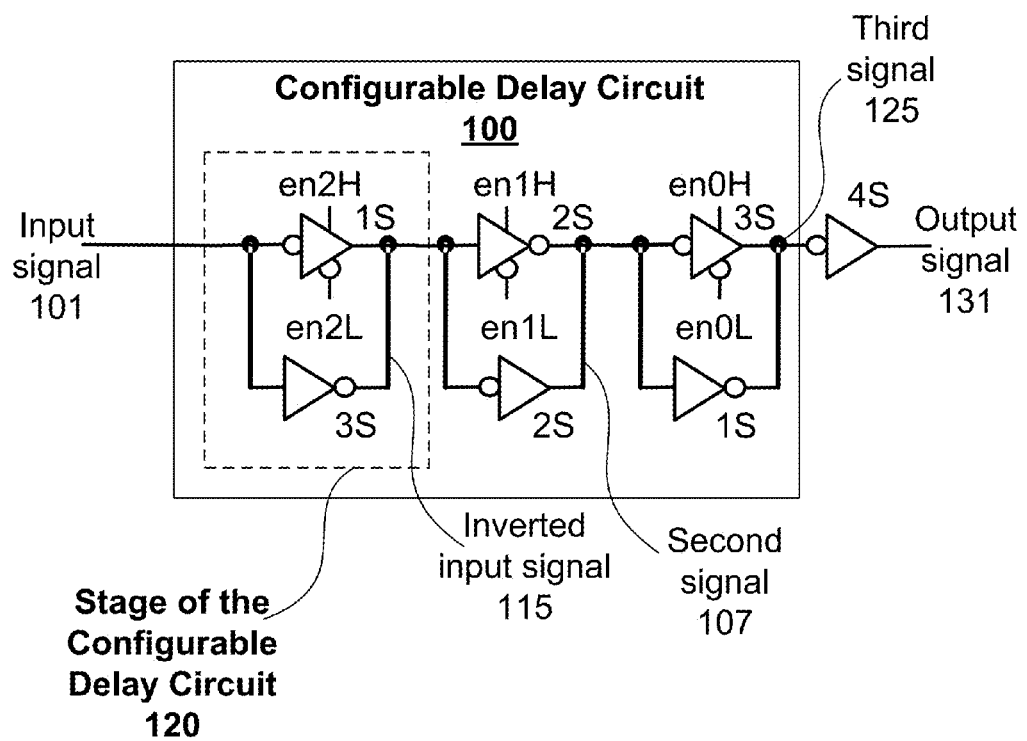
FIG. 1A illustrates a configurable delay circuit, according to one embodiment of the present disclosure.

FIG. 1A illustrates a configurable delay circuit 100, according to one embodiment of the present disclosure. As shown in FIG. 1A, the configurable delay circuit 100 includes three adjustable stages, where each stage (e.g., stage of the configurable delay circuit 100) comprises a fixed inverter coupled in parallel with a tri-state inverter. Other configurable delay circuits may include one or more adjustable stages to generate an output signal that is delayed relative to an input signal based on at least two independent control signals. The configurable delay circuit 100 receives an input signal 101 and generates an output signal 131 that is delayed relative to the input signal 101 based on control signals en2H, en1H, en0H, en2L, en1L, and en0L.

At each stage of the configurable delay circuit 100, the rising edge at the output of a particular stage can be delayed by de-asserting the respective control signal en2L, en1L, and en0L for the particular stage. The falling edge at the output of a particular stage can be delayed by de-asserting the respective control signal en2H, en1H, and en0H for the particular stage. By assembling a series of these stages of the configurable delay circuit 100, a range of control for the timing of each output edge may be achieved. For example, the rising-edge timing at the output signal 131 is controlled by the set of controls en2H, en1L, and en0H. The falling-edge timing at the output signal 131 is controlled by the remaining three controls, e.g., controls en2L, en1H, and en0L. The structure of multiple stages provides a very flexible mechanism for controlling the relative delay between the output and input of each stage and the overall delay of the output signal 131 relative to the input signal 101, because the overall sizing of each stage and the relative sizes of the fixed and adjustable tri-state inverters are free parameters.

Figure 1B:
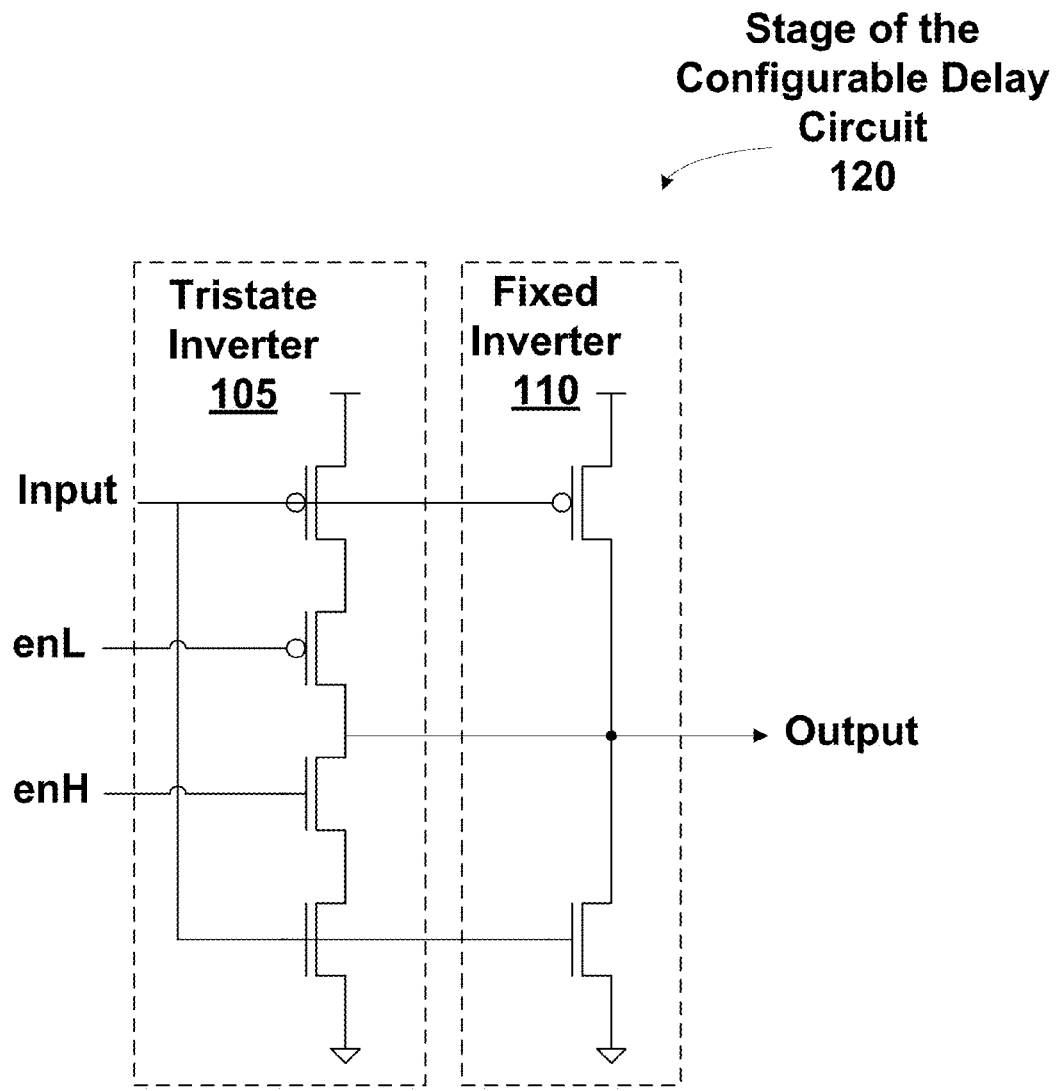
FIG. 1B illustrates a stage of the configurable delay circuit of FIG. 1A, according to one embodiment of the present disclosure.

FIG. 1B illustrates a stage of the configurable delay circuit 100 that is one of the three stages shown in the configurable delay circuit 100 of FIG. 1A, according to one embodiment of the present disclosure. The stage of the configurable delay circuit 100 comprises a tri-state inverter 105 coupled in parallel with a fixed inverter 110. The tri-state inverter 105 and the fixed inverter 110 each receive the input and generate an output that is an inverted version of the input.

The enL control signal enables and disables the pull-up transistor of the tri-state inverter 105. When the active-low enL control signal is asserted (i.e., driven low), the pull-up operation of the tri-state inverter 105 is enabled. When the active-high enH control signal is asserted (i.e., driven high), the pull-down operation of the tri-state inverter 105 is enabled. When neither enL nor enH is asserted the output of the tri-state inverter 105 is in a high impedance state and the output is driven only by the fixed inverter 110.

The fixed inverter 110 provides a first level of drive strength to drive a load at the output. When enL is asserted, the drive strength of a rising transition at the output is greater due to the tri-state inverter 105 pull-up, so the delay of the rising transition is reduced. Similarly, when enH is asserted the drive strength of a falling transition at the output is greater due to the tri-state inverter 105 pull-down, so the delay of the falling transition is reduced. Assuming that the logical effort, a measure of drive strength, for a fixed inverter 110 is 1, the logical effort of the tri-state inverter 105 is 2 when all transistors are equally sized. Therefore, the drive strength of the stage of the configurable delay circuit 100 is increased by 50% with the tri-state inverter 105 is enabled.

The relative drive strength of each stage is determined based on the widths of the transistors comprising the tri-state inverter 105 and the fixed inverter 110. Each stage of the configurable delay circuit 100 can be configured to provide four different delay variations using the control signals enL and enH. A first delay is incurred by the input to generate the output when enL and enH are both de-asserted. The first delay is reduced for the rising edge of the output and the falling edge of the output when enL and enH are both asserted to increase the drive strength of the state of the configurable delay circuit 100. The first delay is reduced only for the rising edge of the output when enL is asserted and enH is de-asserted. Finally, the first delay is reduced only for the falling edge of the output when enH is asserted and enL is de-asserted.

The relative sizing of the transistors comprising the tri-state inverter 105 and the fixed inverter 110 may be used to control the possible delays and reduced delays that are generated by each stage of the configurable delay circuit 100. For example, assuming that each stage in the configurable delay circuit 100 shown in FIG. 1A has a fixed overall sizing (or drive strength) of 4S, there are 3 different possible combinations of relative sizing between the transistors of the tri-state inverter 105 and the transistors of the fixed inverter 110. The fixed inverter 110 may have a size of 3S and the tri-state inverter 105 may have a size of 1S. The fixed inverter 110 may have a size of 2S and the tri-state inverter 105 may have a size of 2S. The fixed inverter 110 may have a size of 1S and the tri-state inverter 105 may have a size of 3S. Each stage of the configurable delay circuit 100 presents a load of 4S to the previous stage (or the input).

Figure 1C:
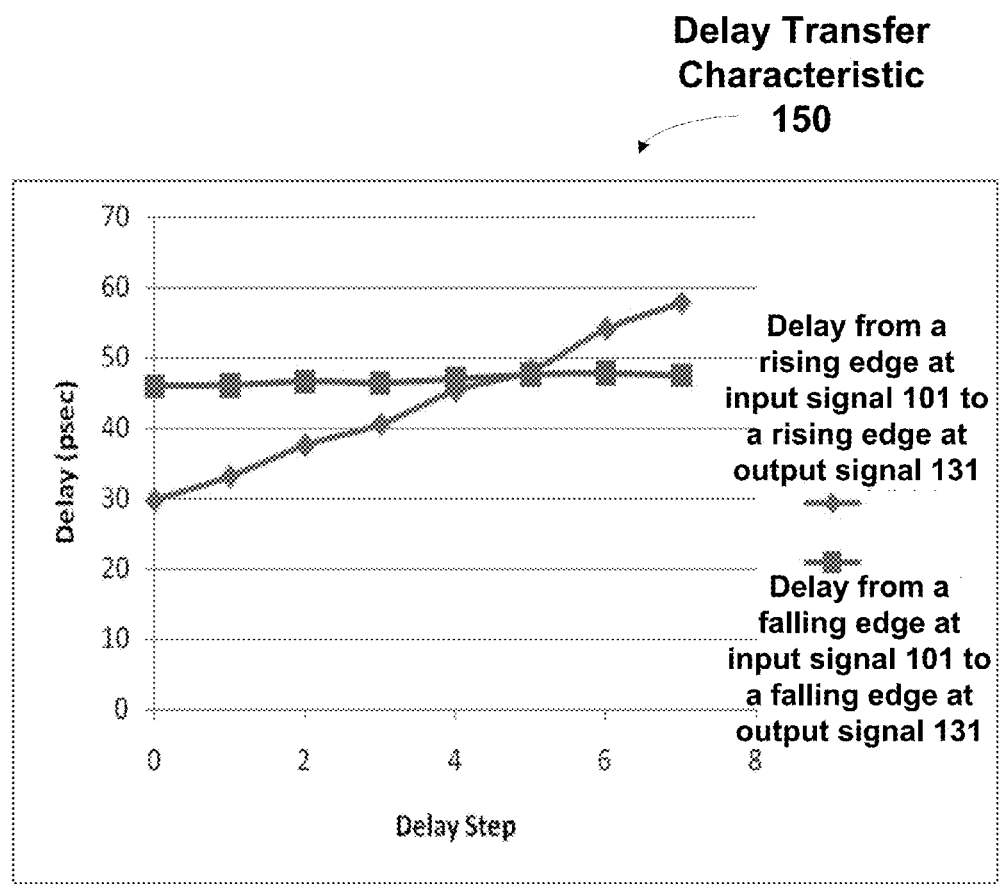
FIG. 1C, illustrates a delay transfer characteristic of the configurable delay circuit of FIG. 1A, according to one embodiment of the present disclosure.

FIG. 1C, illustrates a delay transfer characteristic 150 of the configurable delay circuit of FIG. 1A, according to one embodiment of the present disclosure. As shown in FIG. 1C, the rising edge of the input signal 101 is delayed by varying amounts to generate the rising edge of output signal 131. When en2H is asserted, the pull-down device within the tri-state inverter element in the first stage of the configurable delay circuit 100 is activated to reduce the delay of the transition from the rising edge of the input signal 101 to the falling edge of the inverted input signal 115. When en1L is asserted, the pull-up device within the tri-state inverter element in the second stage of the configurable delay circuit 100 is activated to reduce the delay of the transition from the falling edge of the inverted input signal 115 to the rising edge of the second signal 107. When en0H is asserted, the pull-down device within the tri-state inverter element in the third stage of the configurable delay circuit 100 is activated to reduce the delay of the transition from the rising edge of the second signal 107 to the falling edge of the third signal 125. The output signal 131 is the inversion of the third signal 125, so the falling edge on the third signal 125 produces a rising edge at the output 131.

The delay transfer characteristic 150 corresponds to a configurable delay circuit 100 where the first stage has a tri-state inverter of size 1S and a fixed inverter of size 3S, the second stage has a tri-state inverter of size 2S and a fixed inverter of size 2S, and the third stage has a tri-state inverter of size 3S and a fixed inverter of size 1S.

The lowest delay of approximately 30 picoseconds occurs when the en2H, en1L, and en0H control signals are asserted so that the respective pull-down devices and pull-up device in the tri-state inverter elements are activated. The largest delay of approximately 58 picoseconds occurs when the en2H, en1L, and en0H control signals are un-asserted so that the respective pull-down devices and pull-up device in the tri-state inverter elements that are controlled by the en2H, en1L, and en0H control signals are deactivated.

The rising edge of the input signal 101 is delayed by an increasing amount of time as the en2H, en1L, and en0H control signals progress through the following eight different binary values that each correspond to a different delay step: 101,100,111,110,001,000,011,010, where the minimum delay is specified by 101 and the maximum delay is specified by 010 because en1L is active low. While adjustments in the en2H, en1L, and en0H control signals affect the delay generated on the rising edge of the output signal 131, the adjustments to the en2H, en1L, and en0H control signals do not affect the delay of the falling edge of the output signal 131. As shown in FIG. 1C, the delays introduced during a rising edge transition of the output signal 131 vary linearly based on at least one of the en2H, en1L, and en0H control signals.

The following table represents the different drive strengths of the stages controlled as en2H, en1L, and en0H are adjusted to progressively decrease the delay of the rising edge at the output 131.

| En2H, en1L, en0H | First stage drive strength | Second stage drive strength | Third stage drive strength |
|---|---|---|---|
| 010 | 3 | 2 | 1 |
| 110 | 3½ | 2 | 1 |
| 000 | 3 | 3 | 1 |
| 100 | 3½ | 3 | 1 |
| 011 | 3 | 2 | 2½ |
| 111 | 3½ | 2 | 2½ |
| 001 | 3 | 3 | 2½ |
| 101 | 3½ | 3 | 2½ |

As shown in FIG. 1C, the delay of the falling edge of the output signal 131 remains substantially constant while the en2H, en1L, and en0H control signals vary and the en2L, en1H, and en0L control signals are not adjusted, i.e., are held constant. Similarly, the delay of the rising edge of the output signal 131 remains substantially constant while the en2L, en1H, and en0L control signals vary and the en2H, en1L, and en0H control signals are not adjusted. Also, the delays introduced during a rising edge transition of the output signal 131 vary linearly based on at least one of the en2L, en1H, and en0L control signals.

Figure 2:
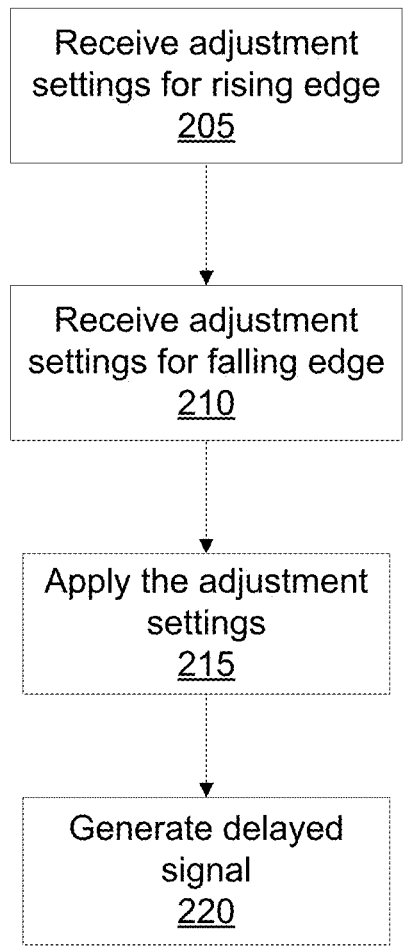
FIG. 2 is a flowchart illustrating a technique for configuring the configurable delay circuit, according to one embodiment of the present disclosure.

FIG. 2 is a flowchart illustrating a technique for configuring the configurable delay circuit 100, according to one embodiment of the present disclosure. Although the method steps are described in conjunction with the configurable delay circuit 100 of FIG. 1A, persons of ordinary skill in the art will understand that any system configured to perform the method steps, in any order, is within the scope of the disclosure. At step 205 control signal settings are received that control a delay incurred by the rising edge of the input signal 101 to generate the output signal 131. In other words, the control signal settings control the delay of the rising edge of the output signal 131 relative to the rising edge of the input signal 101. The control signal settings that control a delay of the rising edge are en2H, en1L, and en0H At step 210 control signal settings are received that control a delay incurred by the falling edge of the input signal 101 to generate the output signal 131. In other words, the control signal settings control the delay of the falling edge of the output signal 131 relative to the falling edge of the input signal 101. The control signal settings that control a delay of the falling edge are en2L, en1H, and en0L. At step 215 the control signal settings are applied to the configurable delay circuit 100 to control the amount of delay incurred by the input signal to generate the output signal. At step 220, the output signal that is delayed relative to the input signal is generated.

The control signals of the configurable delay circuit 100 may be adjusted to independently increase or decrease the delay of a rising transition at the output separately from a falling transition at the output. The configurable delay circuit 100 may be adjusted via the control signals to reduce the delay variation between different signals of a multi-bit bus for rising and/or falling data transitions. A predetermined acceptable delay variation may be identified. The predetermined acceptable delay variation may be identified to improve the functional yield of an integrated circuit for a particular performance level, e.g., clock rate. In one embodiment, the relative drive strengths of the fixed inverter and the tri-state inverter are implemented in the configurable delay circuit 100 so that one or more delay steps equals the predetermined acceptable delay variation.

Timing Calibration of on-Chip Interconnect

The configurable delay circuit 100 may be used to adjust the timing of individual wires transmitting either data or clock signals associated with a communication channel of an on-chip interconnect. Each communication channel typically includes a set of 8 to 16 bytes of data and a pair of forwarded clocks. The number of wires (or links) is limited due to skew and noise in the clock buffering local to the transmitter and receiver circuits at the wire terminals. A first half of the data wires are associated with a first one of the forwarded clocks and the second half of the data wires are associated with a second one of the forwarded clocks, forming two sub-channels: in-phase and quadrature phase components, e.g., I and Q. The timing of the two sub-channels is staggered by 0.5 UI, and the data wires are physically interleaved such that signal transitions on neighboring wires should not occur simultaneously. Furthermore, crosstalk reduction techniques in which outbound wires are interleaved with inbound wires may also be employed.

Conventional on-chip interconnect relies on multiple retiming elements, e.g., flip-flops, that are inserted along the wires of the channel to ensure that timing constraints are met. Rather than inserting multiple retiming elements, a timing calibration technique may be used to measure and configure the different data wires of the channel such that the entire length of each wire may be traversed with only a single retiming element (flip-flop) per data wire at the receiving end. Reducing the number of retiming elements beneficially minimizes latency and power consumption compared with conventional techniques.

Figure 3A:
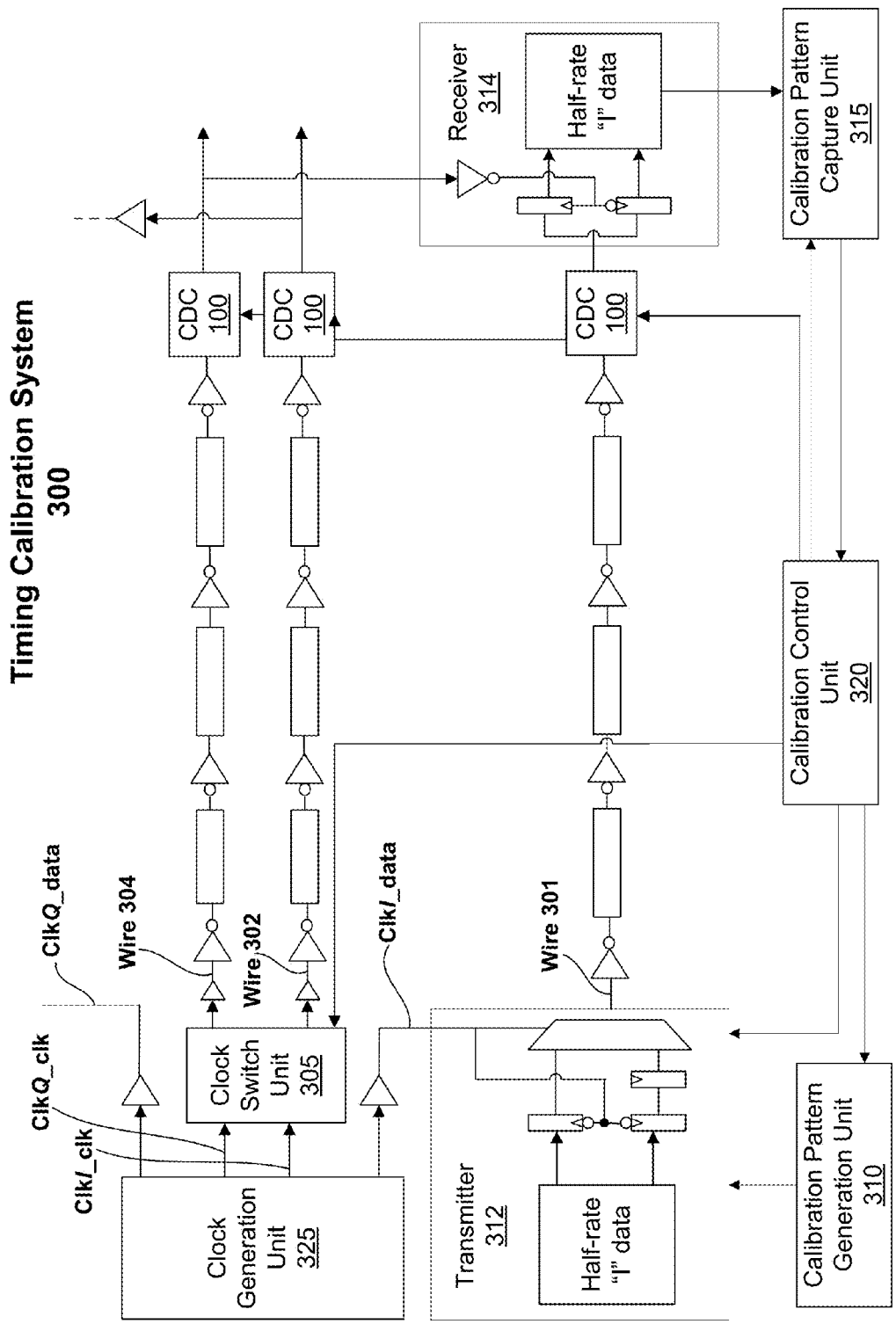
FIG. 3A is a diagram illustrating an on-chip interconnect timing calibration system including the configurable delay circuit for a sub-channel (the in-phase sub-channel), according to one embodiment of the present disclosure.

FIG. 3A is a diagram illustrating an on-chip interconnect timing calibration system 300 including the configurable delay circuit for a sub-channel (the I sub-channel), according to one embodiment of the present disclosure. Although only a single data wire 301 is shown in FIG. 3A, multiple data wires may be included for both the I sub-channel and the Q sub-channel. The timing calibration system 300 includes a clock generation unit 325, a clock switch unit 305, a transmitter 312, a calibration pattern generation unit 310, a calibration pattern capture unit 315, a receiver 316, and a calibration control unit 320. The data wire 301 for transmitting a data signal is coupled between the transmitter 312 and the receiver 316. A pair of forwarded clock signals, ClkI_clk and ClkQ_clk, are transmitted on the clk I wire 302 and the clk Q wire 304, respectively. A configurable delay circuit 100 is also coupled to each of the wires.

The on-chip interconnect relies on a source-synchronous clocking scheme that forwards a clock signal on a clock wire along with the data wires for a channel. The forwarded clock has nominally the same propagation time as the data across a wire, and is used to re-time the data into receiving flip-flops. The source-synchronous technique allows the propagation delay between flops to be longer than a clock period. A source-synchronous technique presents latency and power advantages over a conventional synchronous scheme in which wires are broken into shorter pipelined stages constrained by the clock period. The source-synchronous technique also has advantages over "wave-pipelined" approaches that do not forward a clock signal, but instead use a clock and data recovery system (CDR) to align a receiver clock derived from a global clock distribution network and/or local PLL. In practice, a CDR has a bandwidth limit of a few megahertz, and (unlike a clock-forwarded scheme) may not be able to track the significant amounts of mid- to high-frequency jitter present in any practical implementation.

Additionally, staggering the transition times of coupled data wires within a signaling channel can be used to reduce timing jitter. Delays between data signals can be implemented using the pair of forwarded clocks that are offset relative to each other and are used to time alternate data wires—for example: quarter-cycle paths with in-phase and quadrature (I/Q) double data-rate (DDR) clocks as shown in FIG. 3A. Alternatively, half-cycle paths may be implemented with a full-rate (single data rate, SDR) forwarded clock.

As shown in FIG. 3A, the transmitter 312 is configured to multiplex half-rate data onto the data wire 301 of the I sub-channel using a clock signal, clkI_data. Conversely, the receiver 314 is configured to demultiplex data received on the data wire 301 back down to the half-rate using the forwarded clkQ_clk signal. At the 28-nm CMOS node, the target maximum data rate is about 4 Gb/s. In order to provide interfaces with reasonable data rates for the units generating and receiving the signals that are transmitted on the on-chip interconnect, the transmitter 312 and receiver 314 perform 2:1 serialization and 1:2 deserialization of the data, respectively.

The clock generation unit 325 generates high-speed clocks for the transmitter 312 and the clock switch unit 305. The clock switch unit 305 is configured to select either ClkI_clk or ClkQ_clk for output onto the clock wire of a sub-channel. The calibration pattern generation unit 310 is configured to generate calibration patterns that are used to measure the timing characteristics of each wire. The calibration pattern capture unit 315 is configured to capture patterns generated on the data wire 301 in response to the calibration patterns. The calibration control unit 320 is responsible for sequencing the operations required to trim the delays of the clock and data wires. Finally, the calibration control unit 320 configures the calibration pattern generation unit 310 to apply the calibration patterns to the data wires via the transmitter 312 and configures the calibration pattern capture unit 315 to capture the patterns at the receiver 314. The calibration pattern capture unit 315 and calibration control unit 320 analyze the captured patterns, and, based on the analysis of the captured patterns, the calibration control unit 320 also programs the configurable delay circuits 100. Additionally, the calibration control unit 320 controls the clock switch unit 305 to set the forwarded clock signals as needed during the calibration process. The calibration control unit 320 may be implemented in circuitry, software, or a combination of circuitry and software.

In sum, the calibration system 300 measures the delay offsets of the clock and data wires using phase detection techniques, and corrects the delays, as needed to meet timing constraints, using the configurable delay circuits 100 that are placed in series with the wires of the on-chip interconnect. Timing calibration of a channel is performed separately for each I and Q sub-channel.

The phase of a signal transition on a wire is measured relative to a reference signal using an Alexander phase-detector. The detector is implemented by applying two different calibration pattern generated by the calibration pattern generation unit 310 to the data wire. The two different calibration patterns are 1010 . . . or 0101 . . . The resulting patterns are sampled by the calibration pattern capture unit 315 using the forwarded clock associated with sub-channel in which the wire is included and that is nominally aligned to the edge transitions of the data signal. If a rising data transition is delayed relative to the active clock edge, a "0" will be sampled, i.e., the clock is "early" relative to the data or the data is "late" relative to the clock. If a rising data transition is advanced relative to the active clock edge, a "1" will be sampled, i.e., the clock is "late" relative to the data or the data is "early" relative to the clock. The detection technique provides the sign of the relative offset between selected polarities of clock and data edges. Transitions on the forwarded clock provide the reference for data wire offset measurements. The phase reference for the forwarded clock is defined as the point at which there are an equal number of early and late indications from the set of transitions across the assembly of data wires within a sub-channel.

The calibration control unit 320 configures the calibration pattern capture unit 315 to sample rising or falling data transitions using either rising or falling clock transitions. The patterns repeat every two bits, so 1:2 demultiplexing of the data at the receiver 316 will produce constant values on the half-rate outputs. However, timing noise will cause variation in the sampled constant values near the point at which clock and data transitions are aligned. Such variation can be reduced by accumulating multiple measurements and filtering the multiple measurements.

The calibration method was simulated for an example on-chip interconnect including one hundred 10-mm channels, each 10 bytes wide and operating at 4 Gb/s per wire. The configurable delay circuits were adjustable for 5 different delays (0, +/−1, and +/−2 adjustment steps around a central point), with each adjustment step equal to approximately 10 ps. Random offsets were independently applied to the positive and negative signal transition polarities for each wire, and then the calibration process was employed to measure the timing of the wires and program the configurable delay circuits. The results of the simulation are shown in FIGS. 3B and 3C.

Figure 3B:
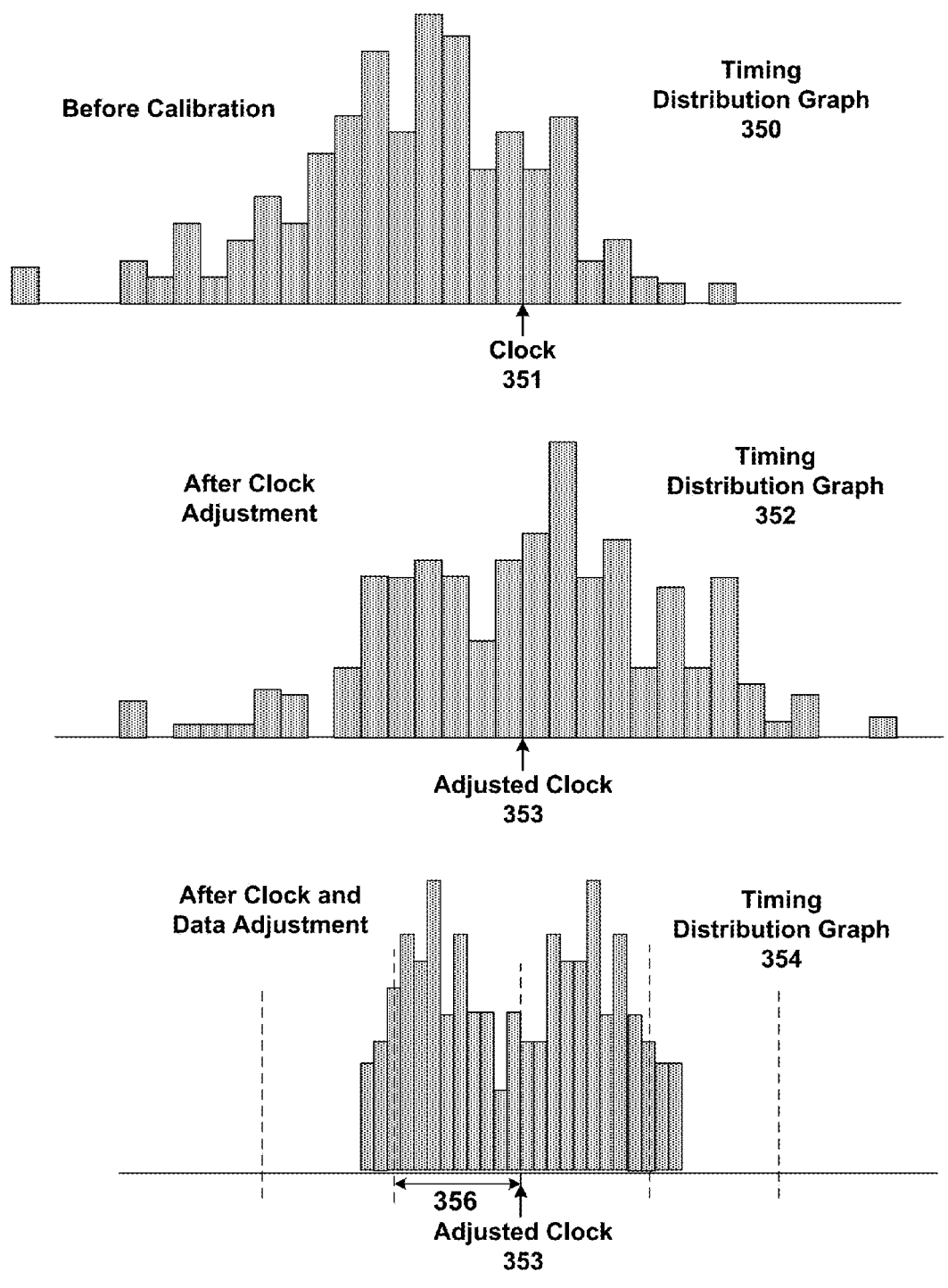
FIG. 3B are graphs illustrating clock to data delay offsets before, during, and after the calibration process for a single channel of an on-chip interconnect, according to one embodiment of the present disclosure.

FIG. 3B are graphs illustrating clock to data delay offsets before, during, and after the calibration process for a single channel of an on-chip interconnect, according to one embodiment of the present disclosure. The top timing distribution graph 350 is a histogram showing that before any calibration there is a mean offset of about 10 ps, and the range of delay offsets is about 55 ps. Before the data wires are calibrated, the wires transmitting the clock 351 are calibrated. After the clock calibration, the middle timing distribution graph 352 shows that the systematic component of the delay offset is removed, but the range of delay offsets remains about 50 ps. Once the clock wire is calibrated to produce adjusted clock 353, the data wires are calibrated to complete the calibration process. After the clock and data wires are both calibrated, the distribution tightens dramatically, as shown in the bottom timing distribution graph 354. After calibration most of the delay offsets are limited to a range of +/− one adjustment step size 356. The two peaks in the distribution shown in the timing distribution graph 354 correspond to the residual error in the placement of the rising and falling edges of the forwarded clock that is based on the adjusted clock 353.

Figure 3C:
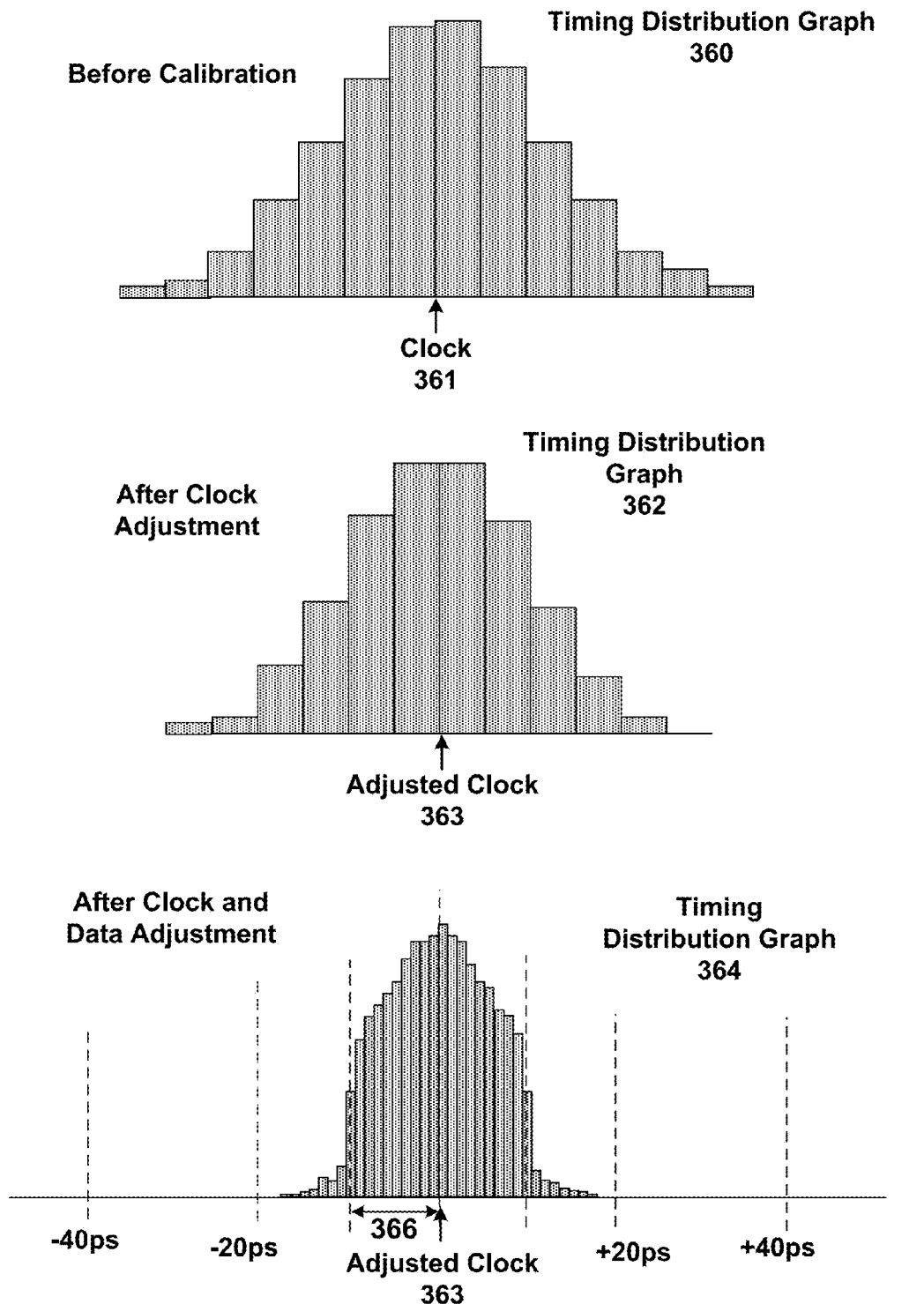
FIG. 3C is a graph illustrating clock to data delay offsets during calibration for a an assembly of 100 channels, according to one embodiment of the present disclosure.

FIG. 3C are graphs illustrating clock to data delay offsets before, during, and after calibration for 100 channels of an on-chip interconnect, according to one embodiment of the present disclosure. The top timing distribution graph 360 is a histogram of the delay offsets before any calibration of the wires transmitting the clock 361. The middle timing distribution graph 362 shows the delay offsets after the clock calibration. The bottom timing distribution graph 364 shows the delay offsets after the clock and data wires are both calibrated.

With the larger sample set, the distribution of delays shown in FIG. 3C are more completely filled in. The thickness in the tails near the boundary of the central distribution is due to residual adjustment error in the forwarded clocks. Idealized clock adjustment produces sharp boundaries of the high-probability region of the timing distribution graphs 362 and timing distribution 364.

The timing margin budget used for the example is 0.36 UI, or 90 ps which must be met by the residual timing offsets after calibration. After calibration most of the delay offsets are limited to a range of +/− one adjustment step size 366. As shown in FIG. 3C, for the simulated on-chip interconnect of 100 channels, the range of the offset delays was compressed from about 100 ps to 40 ps, which satisfies the timing margin budget.

A more detailed analysis shows that for a fixed number of adjustment steps in the configurable delay circuit 100, there is an optimal adjustment step size for maximizing link yield, which in turn, maximizes chip yield. In the above example, calibration with a four adjustment step configurable delay circuit 100 can reduce the failure rate for an on-chip interconnect of 100 channels from unity (100% failure) to better than 1e-5 (0.001% failure). A six adjustment step configurable delay circuit can achieve better than a 1 e-7 failure rate (0.00001% failure).

In one embodiment, a predetermined acceptable delay variation is specified within which the delay of each data wire needs to lie for a particular target chip yield to be achieved. The target chip yield is typically based on a maximum BER (bit error rate) for the on-chip interconnect. The adjustment step size may be set equal to the predetermined acceptable delay variation and the configurable delay circuit 100 may be configured to adjust the delay of each wire by an integer number of the adjustment step sizes to increase or decrease the delay of the wire.

Figure 3D:
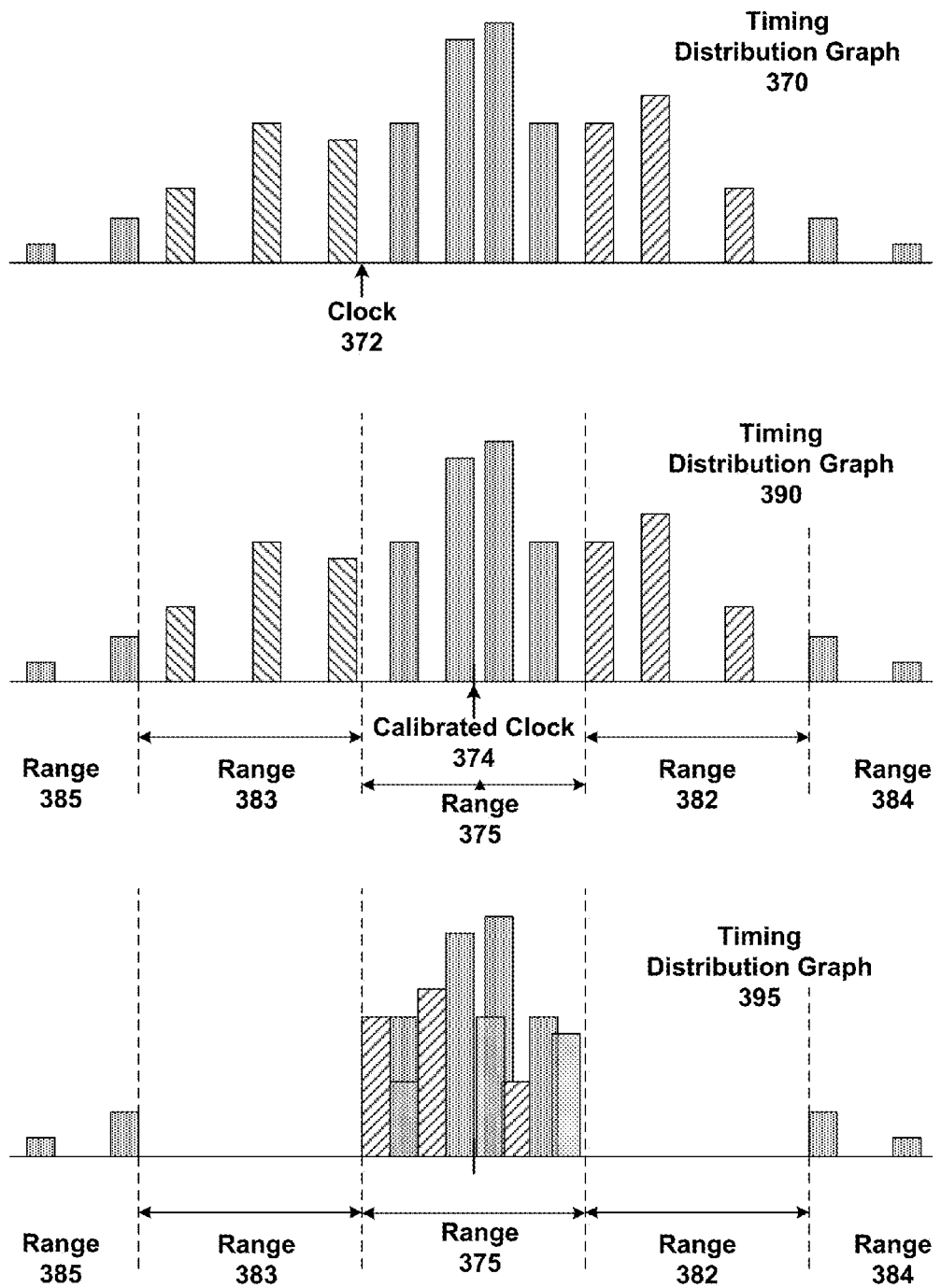
FIG. 3D are graphs illustrating the predetermined acceptable delay variation and clock to data delay offsets before, during, and after calibration for wires of an on-chip interconnect, according to one embodiment of the present disclosure.

FIG. 3D are graphs illustrating the predetermined acceptable delay variation and clock to data delay offsets before, during, and after calibration for wires of an on-chip interconnect, according to one embodiment of the present disclosure. The top graph is a timing distribution graph 370 of the delay offsets before any calibration. Note that the sampling clock edge 372 is not substantially centered within the distribution of the delay offsets. As shown, the number of wire delays that are positive relative to the sampling clock edge 372 is greater than the number of wire delays that are negative relative to the sampling clock edge 372.

The middle graph is a timing distribution graph 390 of the delay offsets after the clock calibration and the sampling clock edge 372 is now calibrated, e.g., calibrated clock 374, and is substantially centered within the distribution of the delays offsets. In other words, the number of data wires having delays that are positive relative to the sampling clock edge approximately equals the number of data wires having delays that are negative relative to the sampling clock edge. Importantly, for both the timing distribution graph 370 and the timing distribution graph 390, the sampling clock edge is in-phase with the data signals so that the data wire rising and falling edge delays are measured relative to the calibrated clock edge 374.

A range 375 is shown centered at the calibrated clock edge 374. In one embodiment the range 375 is equal to the predetermined acceptable delay variation. Wires having delays that lie outside of the range 375 are considered outliers and the delay of each of the outlier wires is individually adjusted to position the outliers within the range of the range 375 during the data wire calibration process. For example, the configurable delay circuits 100 in series with the data wires of outliers within the range 382 are adjusted to decrease the delay of the respective data wires by one adjustment step size. When the adjustment step size is equal to the predetermined acceptable delay variation (range 375), all of the outliers within the range 382 are shifted to lie within the range of the predetermined acceptable delay variation 375. Similarly, the configurable delay circuits 100 in series with the data wires of outliers within the range 383 are adjusted to increase the delay of the respective data wires by one adjustment step size. All of the outliers within the range 383 are shifted to lie within the range of the range 375 when the adjustment step size is equal to the range 375.

Thus, the adjustment step size may be coarse compared with a smaller adjustment step size that is configured to shift the delay of a data wire by a minimum amount needed to lie within the range 375. A coarse precision for adjustments is advantageous because a configurable delay circuit 100 having finer precision adjustment step sizes typically consumes more power.

When the configurable delay circuit 100 may be adjusted to insert a delay of two adjustment step sizes, the data wires of outliers within the range 384 may be adjusted to decrease the delay of the respective data wires by two adjustment step sizes. Similarly, the data wires of outliers within the range 385 may be adjusted to increase the delay of the respective data wires by two adjustment step sizes. The bottom graph 395 shows the wire delays after the clock and data wires are both calibrated and the data wires adjusted by one adjustment step size lie within the predetermined acceptable delay variation (range 375).

Figure 4A:
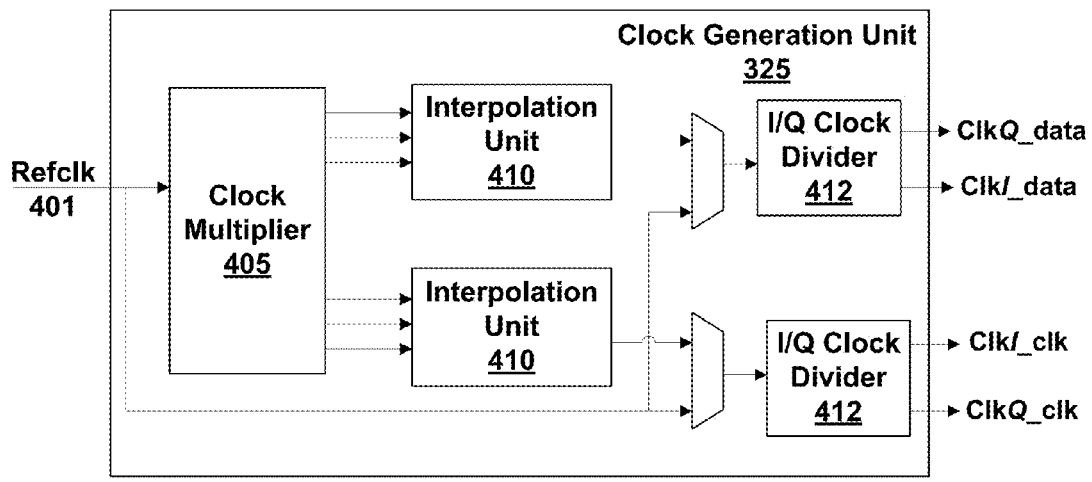
FIG. 4A is a block diagram of the clock generation unit shown in FIG. 3A, according to one embodiment of the present disclosure.

FIG. 4A is a block diagram of the clock generation unit 325 shown in FIG. 3A, according to one embodiment of the present disclosure. The clock generation unit 325 includes a clock multiplier 405, interpolation units 410, and I/Q clock dividers 412. Each end of a communication channel has a phase-locked-loop (PLL) that is included within the clock multiplier 405 to generate the high-speed clocks for the interface between a core logic unit and the on-chip interconnect. The PLL is typically used to multiply a local core clock, such as refclk 401, to generate a high-speed clock for the on-chip interconnect.

In addition to a PLL, the clock generation unit 325 also contains a 360-degree phase rotator. In one embodiment, a 1-GHz reference clock is multiplied by 4 and a set of six-phase, 4-GHz clocks are generated by the clock multiplier unit 405. The clocks in the set of clocks serve as reference phases for a pair of interpolation units 410. The interpolation units 410 are each a 360-degree phase rotator. The output of each interpolation unit 410 drives a respective clock divider 412 that generates double-data-rate (DDR) in-phase (I) and quadrature (Q) clocks—that is, a pair of 2-GHz clocks with one clock delayed by 125 ps relative to the other (0.5 UI). One of the I/Q clock outputs drives local transmit circuitry, e.g., transmitter 312, while the other clock output is used to drive the forwarded clocks, e.g., ClkI_clk and ClkQ_clk, for each sub-channel of a channel.

Separating the clock paths for the transmitter 312, e.g., ClkI_data and ClkQ_data, from the forwarded clocks, e.g., ClkI_clk and ClkQ_clk, allows the phase of the forwarded clocks to be adjusted relative to the data, to optimize alignment and/or to measure the timing margin for each data wire. Note that the quadrature (ClkQ_clk) forwarded clock is used to sample I sub-channel data at the receive end of the wire and the (inverted) in-phase (ClkI_clk) forwarded clock is used to sample the Q sub-channel data. The sampling arrangement nominally places the clock edges in the middle of the data eye for each sub-channel. The edge of the clock signal is substantially centered between transitions of a signal transmitted on the data wire when the clock signal edges are placed in the middle of the data eye. At high data rates, the clock generation technique does not result in an excessively large clock insertion delay penalty. Also, the forwarded clock phases can be advanced relative to the data if excess timing margin exists.

Figure 4B:
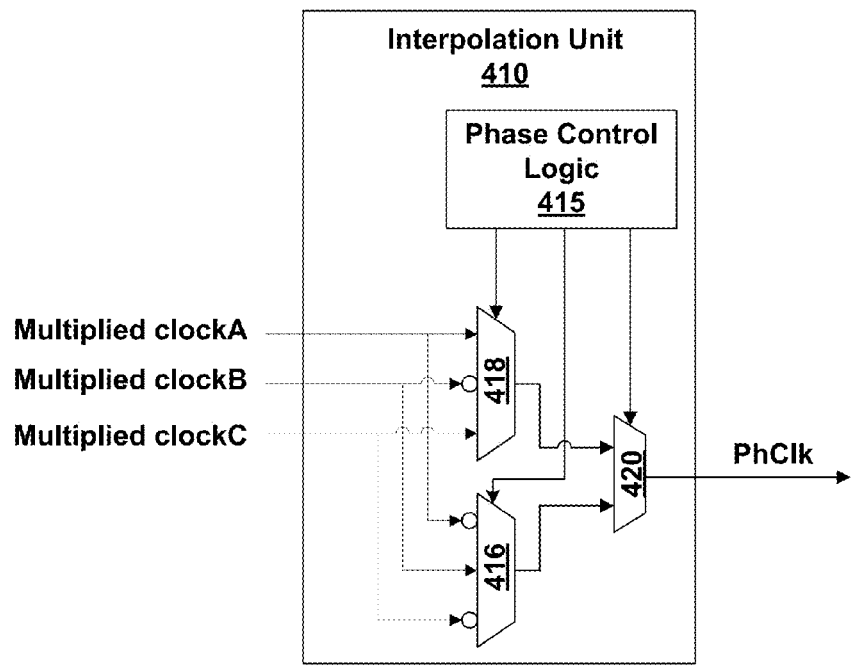
FIG. 4B is a block diagram of the interpolation unit of FIG. 4A, according to one embodiment of the present disclosure.

FIG. 4B is a block diagram of the interpolation unit 410 of FIG. 4A, according to one embodiment of the present disclosure. The interpolation unit 410 functions as a 360-degree wrapping phase interpolator that is adjustable in N steps, where N may equal 48. A phase control unit 415 is configured by the calibration control unit 320 to adjust the phase of a clock generated by the clock generation unit 325. The 3:1 multiplexers 416 and 418 are configured to select two adjacent clock phases that are interpolated. A linear interpolator 420 is controlled by a number of digital control wires from the phase control logic 415 such that the phase of PhClk can vary in steps between one of the selected reference phase, e.g., multiplied clockA, multiplied clockB, and multiplied clockC, and another reference phase, e.g., multiplied clockA, multiplied clockB, and multiplied clockC.

Figure 4C:
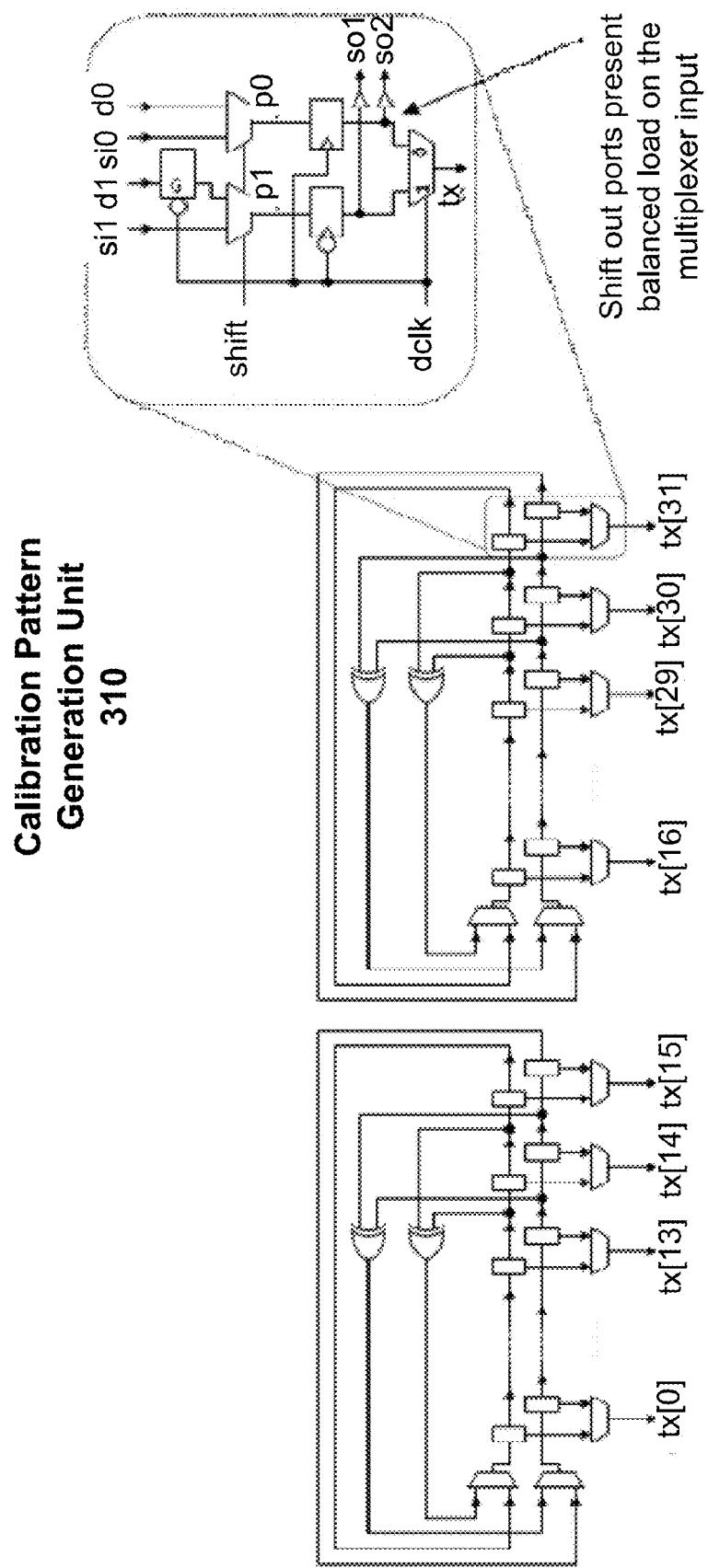
FIG. 4C is a block diagram of the calibration pattern generation unit of FIG. 3A, according to one embodiment of the present disclosure.

FIG. 4C is a block diagram of the calibration pattern generation unit 310 of FIG. 3A, according to one embodiment of the present disclosure. The calibration pattern generation unit 310 includes linear-feedback shift registers (LFSRs) for test and calibration pattern generation. The LFSRs are striped across the wires, re-using the registers associated with the 2:1 data serializers (used for test functions) to reduce power and circuit area. In the embodiment shown in FIG. 4C, the transmitting wires are grouped into two-byte LFSRs, having feedback taps that enable 2:1 serialization of independent $2^{15}-1$ pseudo-random binary sequence (PRBS) data streams and simple looping of a 32-bit static pattern. The shift-in and shift-out paths can be selected into the serializer register paths to enable the LFSR. The pattern-generation capability is useful for built-in self-test (BIST), and required for the timing calibration method, as described further herein.

Figure 4D:
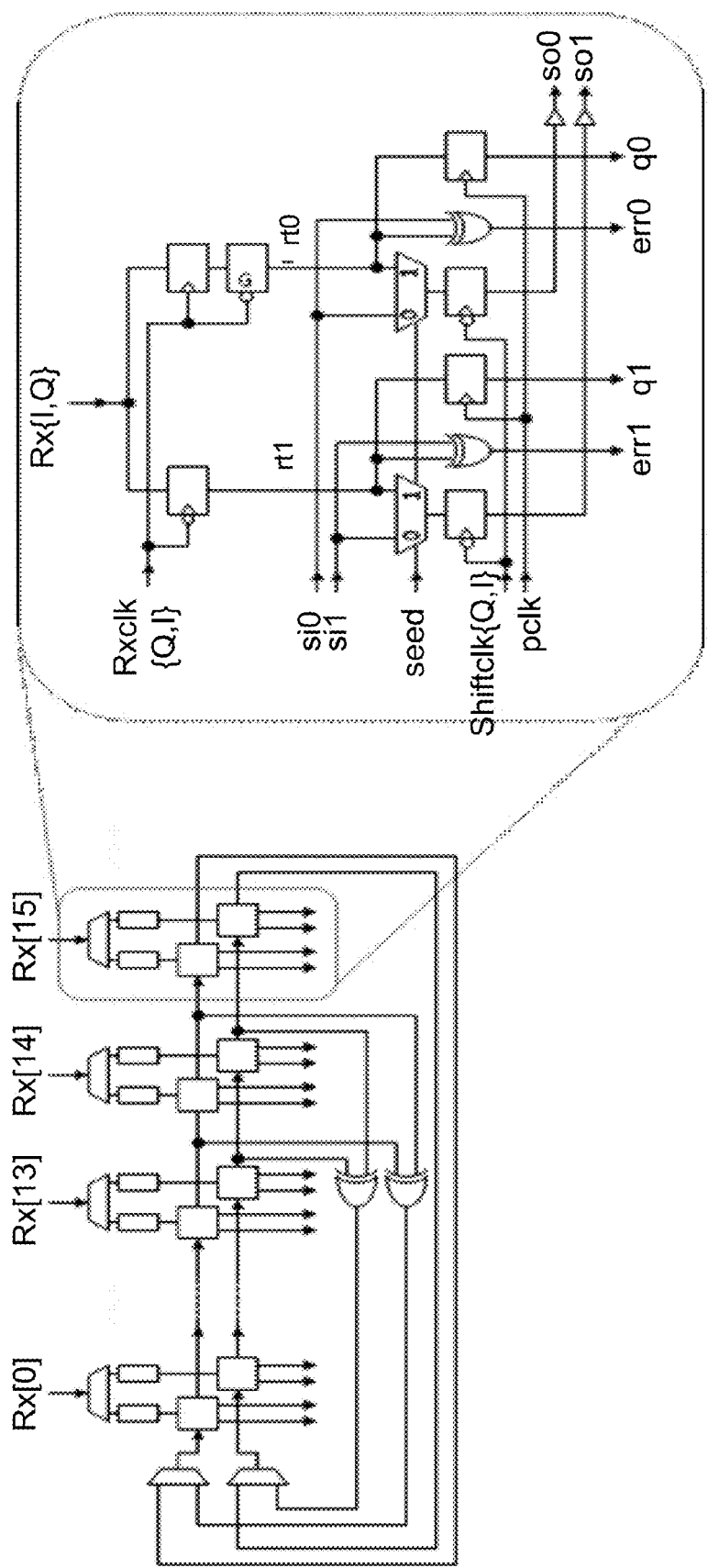
FIG. 4D is a block diagram of the calibration pattern capture unit of FIG. 3A, according to one embodiment of the present disclosure.

FIG. 4D is a block diagram of the calibration pattern capture unit 315 of FIG. 3A, according to one embodiment of the present disclosure. The calibration pattern capture unit 315 also includes a set of LFSRs that are complementary to those of the calibration pattern generation unit 310. The calibration pattern capture units 315 allow per-wire checking of PRBS and static patterns. Providing dedicated registers for the LFSR in prevents incoming errors from corrupting the reference pattern shifting around the ring, and provides a second gated clock path for capturing half-rate data on the deserializer output. The error outputs are sent to dedicated error-checking logic, and captured values are provided to the calibration control unit 320.

Figure 5A:
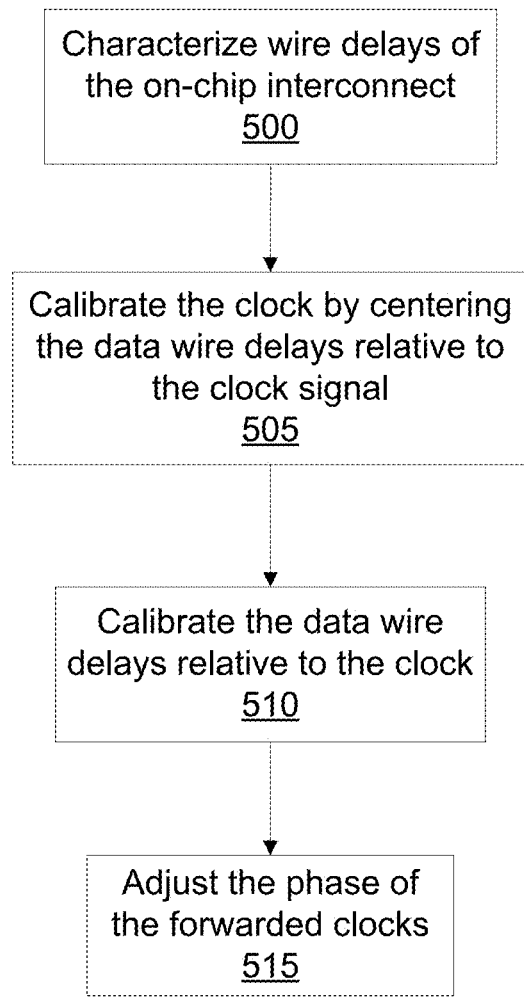
FIG. 5A is a flowchart illustrating a technique for calibrating on-chip interconnect, according to one embodiment of the present disclosure.

FIG. 5A is a flowchart illustrating a technique for calibrating on-chip interconnect, according to one embodiment of the present disclosure. Although the method steps are described in conjunction with the timing calibration system 300 of FIG. 3A, the clock generation unit 325 of FIG. 4A, the calibration pattern generation unit 310 of FIG. 4C, and the calibration pattern capture unit 315 of FIG. 4D, persons of ordinary skill in the art will understand that any system configured to perform the method steps, in any order, is within the scope of the disclosure.

At step 500 the timing calibration system 300 generates a plurality of measurements to characterize the wire delays of the on-chip interconnect. The calibration pattern generation unit 310 is configured to apply a first signal transition pattern to wires of the on-chip interconnect to generate a plurality of first measurements. The calibration pattern generation unit 310 is then configured to apply a second signal transition pattern to the wires of the on-chip interconnect to generate a plurality of second measurements.

At step 505, the clock signal for each sub-channel is calibrated by centering the clock signal relative to a distribution of the measured wire delays for the sub-channel. A detailed flowchart for step 505 is described in conjunction with FIG. 5B. A predetermined acceptable delay variation is specified for the wires of the on-chip interconnect. The predetermined acceptable delay variation corresponds to a target chip yield and when one or more of the wires fall outside of the range predetermined acceptable delay variation, the target chip yield may not be met. Once the clock signal is centered relative to the distribution of the measured wire delays, the clock signal is also centered relative to the range of predetermined acceptable delay variation.

At step 510, the data wire delays are calibrated relative to the centered clock so that data wires having delays that fall outside of the range of predetermined acceptable delay variation are adjusted. Based on the plurality of first measurements and the plurality of second measurements, the calibration control unit 320 programs one or more of the configurable delay circuits 100 to adjust delay of the wires, as needed, to fall within the range of the predetermined acceptable delay variation. Finally, at step 515, the phase of the forwarded clocks is adjusted so that the clock edges are centered between data transitions for each sub-channel. A detailed flowchart for step 510 is described in conjunction with FIG. 5B.

Figure 5B:
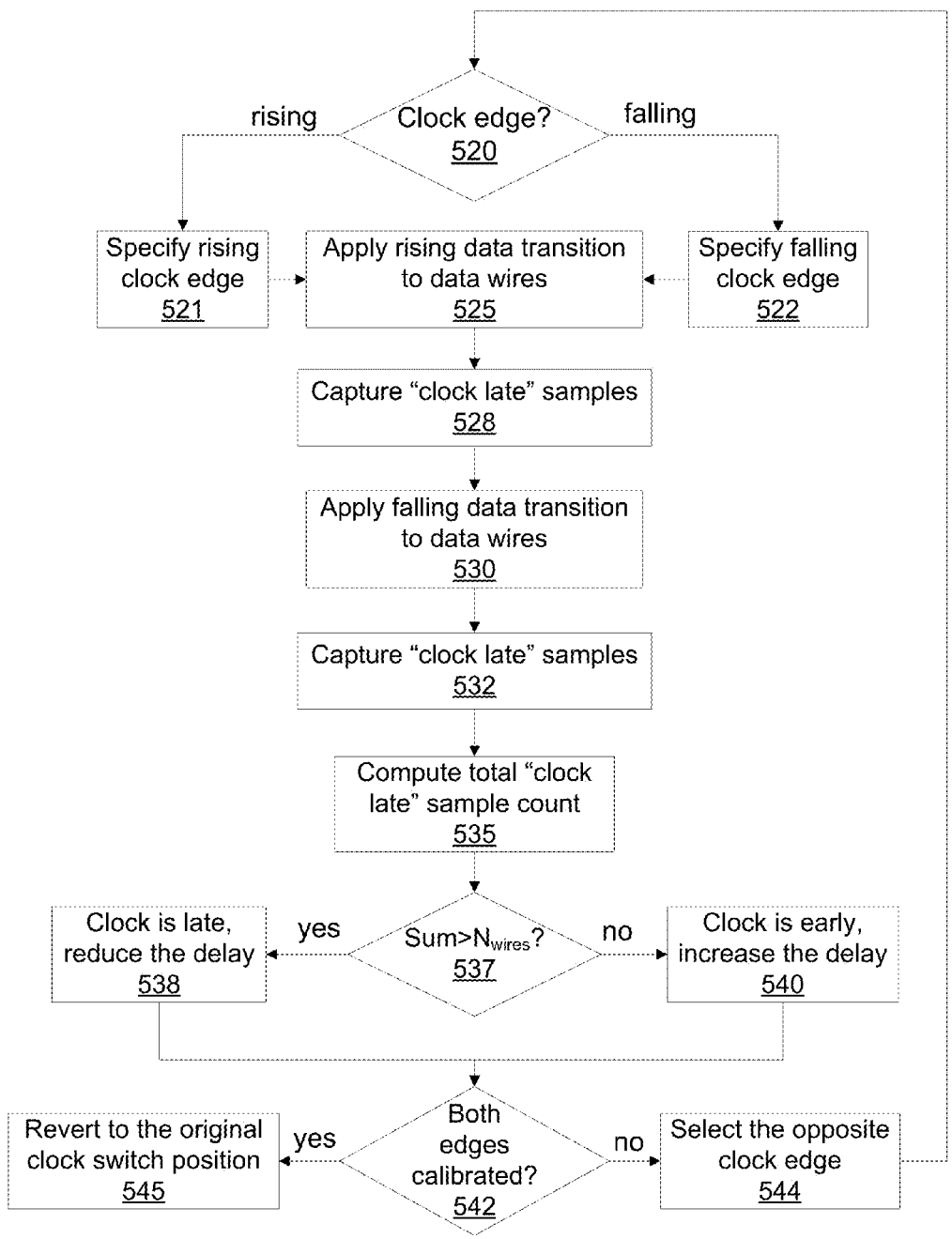
FIG. 5B is a flowchart illustrating a technique for calibrating on-chip interconnect for a clock signal, according to one embodiment of the present disclosure.

FIG. 5B is a flowchart illustrating a technique of step 505 of FIG. 5A for calibrating on-chip clock interconnect, according to one embodiment of the present disclosure. Although the method steps are described in conjunction with the timing calibration system 300 of FIG. 3A, the clock generation unit 325 of FIG. 4A, the calibration pattern generation unit 310 of FIG. 4C, and the calibration pattern capture unit 315 of FIG. 4D, persons of ordinary skill in the art will understand that any system configured to perform the method steps, in any order, is within the scope of the disclosure.

At step 520 the clock wire calibration process begins by identifying the clock edge as rising or falling. At step 522 the clock calibration control unit 320 specifies the falling clock edge for calibration. At step 521, the clock calibration control unit 320 specifies the rising clock edge for calibration. At step 525 a rising data transition signal is applied by the calibration pattern generation unit 310 to the data wires of the on-chip interconnect. At step 528 the calibration pattern capture unit 315 counts "clock late" samples, i.e., rising data transitions that occur before the sampling clock edge and are sampled as data high.

At step 530 a falling data transition signal is applied by the calibration pattern generation unit 310 to the data wires of the on-chip interconnect. At step 532 the calibration pattern capture unit 315 counts "clock late" samples. At step 535, the calibration control unit 320 receives the counts of "clock late" samples from the calibration pattern capture unit 315 and computes a total count (sum) of the "clock late" samples by summing the counts generated at steps 528 and 532. At step 537, the calibration control unit 320 determines if the sum is greater than the number of data wires, Nwires. If, at step 537 the calibration control unit 320 determines that the sum is greater than the number of data wires, then at step 538 the clock is late and the configurable delay circuit 100 that is in series with the clock wire being calibrated is configured by the calibration control unit 320 to reduce the delay. If, at step 537 the calibration control unit 320 determines that the sum is not greater than the number of data wires, then at step 540 the clock is early and the configurable delay circuit 100 that is in series with the clock wire being calibrated is configured by the calibration control unit 320 to induce the delay.

At step 542 the calibration control unit 320 determines if the both edges of the clock have been adjusted so that the calibration is complete, and, if not, at step 544 the calibration control unit 320 configures the clock switch unit 305 to calibrate the opposite clock edge and return to step 520.

Otherwise, at step 545, the calibration control unit 320 configures the clock generation unit 325 to revert back to the original clock switch position. In other words, during calibration the clock signal is in-phase with the data signals so that the data signals may be measured relative to the clock signal. When step 545 is reached, the clock signal edge is centered within the distribution of the delay variations. For normal operation, the clock signal should be out of phase with the data signals, so that the clock edge is centered within an eye of data signal transitions to best sample the data signals. Therefore, at step 545, the clock generation unit 325 is configured to adjust the clock signal to be out of phase by 90 degrees relative to the data signal transitions.

Figure 6:
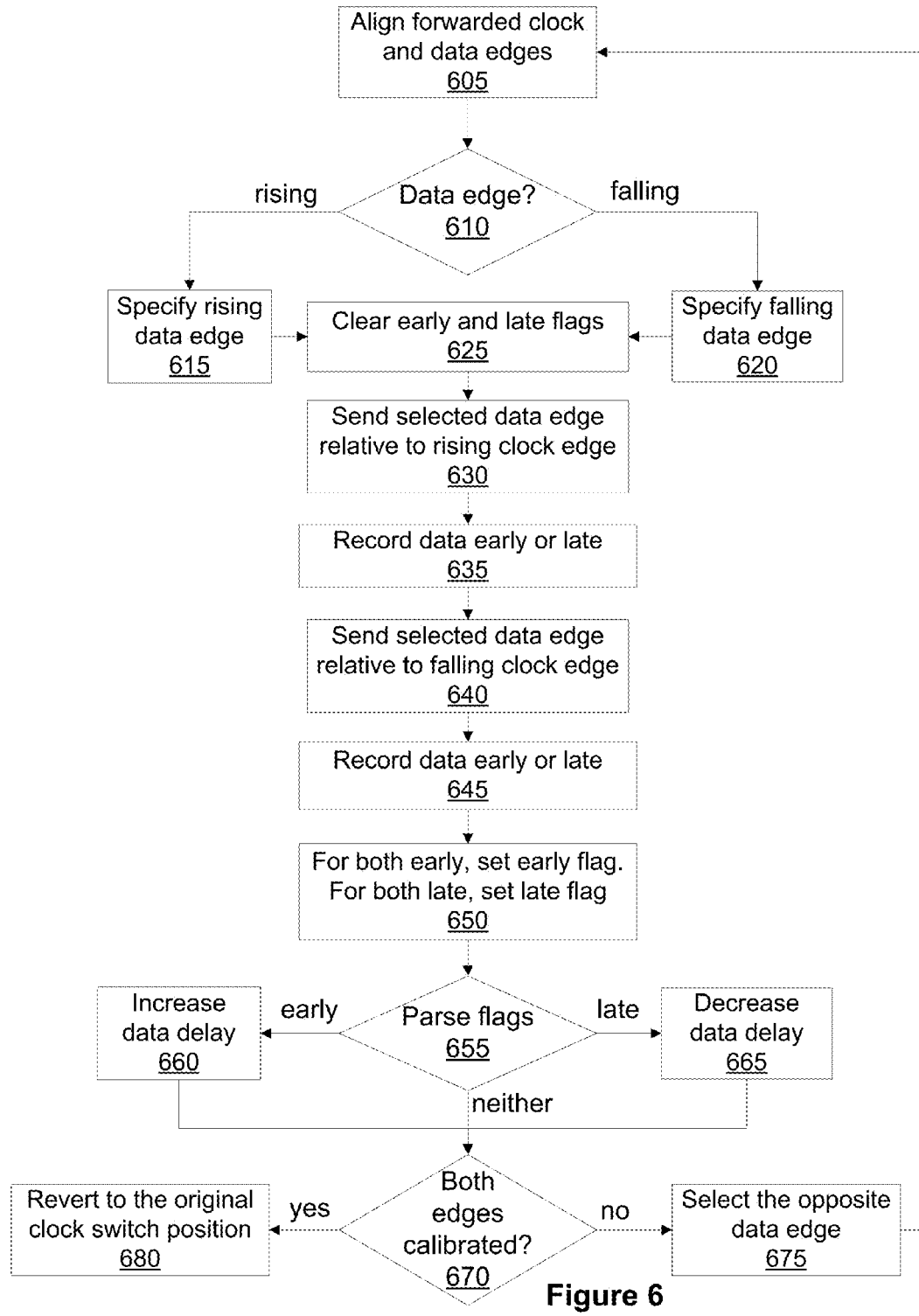
FIG. 6 is a flowchart illustrating a technique for calibrating on-chip interconnect for a data signal, according to one embodiment of the present disclosure.

FIG. 6 is a flowchart illustrating a technique for calibrating data wires of the on-chip interconnect to perform step 510 of FIG. 5A, according to one embodiment of the present disclosure. Although the method steps are described in conjunction with the timing calibration system 300 of FIG. 3A, the clock generation unit 325 of FIG. 4A, the calibration pattern generation unit 310 of FIG. 4C, and the calibration pattern capture unit 315 of FIG. 4D, persons of ordinary skill in the art will understand that any system configured to perform the method steps, in any order, is within the scope of the disclosure.

At step 605 the calibration control unit 320 configures the clock generation unit 325 to align the edges of the forwarded clock signal(s) with the data edges. At step 610 the data wire calibration process begins by identifying the data edge as rising or falling. At step 620 the calibration control unit 320 specifies the falling clock edge for calibration. At step 615, the calibration control unit 320 specifies the rising clock edge for calibration.

At step 625 the early and late flags maintained for the data wires by the calibration pattern capture unit 315 are cleared. Separate flags are maintained by the calibration pattern capture unit 315 for each data wire. At step 630 a rising or falling data (whichever was specified at step 615 or 620) transition signal is applied by the calibration pattern generation unit 310 to the data wires of the on-chip interconnect. At step 635 the calibration pattern capture unit 315 records whether the data is early or late relative to the forwarded rising clock edge.

The data is recorded as early when a "0" is captured for a rising data transition and the data is recorded as late when a "1" is captured for a rising data transition. Similarly, the data is recorded as early when a "1" is captured for a falling data transition and the data is recorded as late when a "0" is captured for a falling data transition.

At step 640 a rising or falling data (whichever was specified at step 615 or 620) transition signal is applied by the calibration pattern generation unit 310 to the data wires of the on-chip interconnect. At step 645 the calibration pattern capture unit 315 records whether the data is early or late relative to the forwarded falling clock edge. At step 650 the calibration pattern generation unit 310 sets the flags based on the data recorded at steps 635 and 645. When the data recorded for both the rising edge and the falling edge of the forwarded clock is early, the early flag for the data wire is set. When the data recorded for both the rising edge and the falling edge of the forwarded clock is late, the late flag for the data wire is set. For each data wire either the early flag or the late flag may be set or both flags may be cleared indicating that the data wire is neither early nor late.

At step 655, the calibration control unit 320 receives the flags from the calibration pattern capture unit 315 and parses the flags. If, at step 655, the calibration control unit 320 determines a data wire has the early flag set, then at step 660, the configurable delay circuit 100 that is in series with the data wire being calibrated is configured by the calibration control unit 320 to increase the delay of the data wire. If, at step 655, the calibration control unit 320 determines a data wire has the late flag set, then at step 665, the configurable delay circuit 100 that is in series with the data wire being calibrated is configured by the calibration control unit 320 to decrease the delay of the data wire. If, at step 655, the calibration control unit 320 determines a data wire has neither flag set, then at step 665, the configurable delay circuit 100 that is in series with the data wire being calibrated is configured by the calibration control unit 320 to neither increase nor decrease the delay of the data wire.

At step 670 the calibration control unit 320 determines if the data signals have been adjusted for both clock edges so that calibration is complete and, if not, at step 675 the calibration control unit 320 selects the opposite clock edge of the data signals and returns to step 605. Otherwise, at step 680, the calibration control unit 320 configures the clock generation unit 325 to revert back to the original clock switch position, i.e., the clock signal is adjusted to be out of phase by 90 degrees relative to the data signal transitions.

Figure 7:
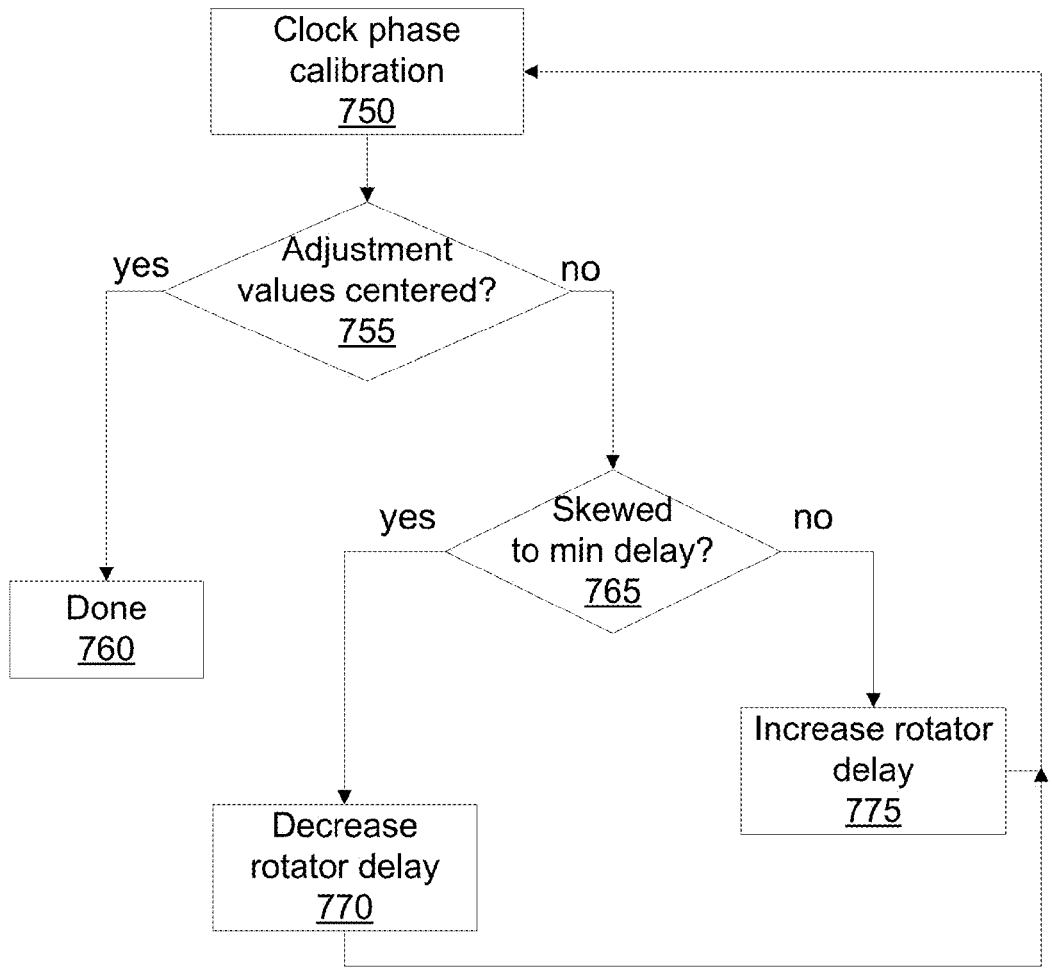
FIG. 7 is a flowchart illustrating a technique for performing clock phase adjustments, according to one embodiment of the present disclosure.

FIG. 7 is a flowchart illustrating a technique for performing step 515 of FIG. 5A to make clock phase adjustments, according to one embodiment of the present disclosure. Although the method steps are described in conjunction with the timing calibration system 300 of FIG. 3A, the clock generation unit 325 of FIG. 4A, the calibration pattern generation unit 310 of FIG. 4C, and the calibration pattern capture unit 315 of FIG. 4D, persons of ordinary skill in the art will understand that any system configured to perform the method steps, in any order, is within the scope of the disclosure.

The ability to control the relative phase of the forwarded clocks and data with phase rotators can be used to correct systematic clock skew. During the clock and data wire calibration processes, the configurable delay circuits 100 for each wire are designed to compensate for wire delay variation due to variations in the CMOS fabrication process. However, there are other potential sources of systematic skew between clock and data signals, such as asymmetry in the clock buffers at the transmitter and receiver ends of the link, and aperture offsets in the receiver flip-flops. Adjustments of the forwarded clock phase can be made to compensate for such offsets.

The clock delay calibration process described in conjunction with FIG. 5B results in two adjustment values (e.g., control signal settings) for the configurable delay circuit 100: one each for rising and falling transition polarities. The goal of the phase rotator adjustment is to center the two adjustment values up within the range of the configurable delay circuit 100. For example, if both adjustment values are pegged to the minimum or maximum delay, the skew between the forwarded clock and data signals must be larger than the throw of the clock delay element, where the throw is the maximum delay that the configurable delay circuit 100 may produce. As we remove this clock-to-data skew with the phase rotator, the two adjustment values will move toward the center of the delay adjustment range, i.e., no increase and no decrease in the delay. The criterion for centering the adjustment codes is to place the average of the two delay adjustment values as close to the central value as possible.

Returning to FIG. 7, at step 750 the clock delay element calibration to adjust for clock skew begins. At step 755 the calibration control unit 320 determines if the adjustment values for the data wires are centered, and if so, at step 760 the clock phase adjustment process is complete. Otherwise, at step 765 the calibration control unit 320 determines if the adjustment values are set to minimize the delay of the data wires, and, if so, at step 775 the clock generation unit 325 is configured to increase the phase rotator delay before returning to step 750. Otherwise, at step 770, the clock generation unit 325 is configured to decrease the phase rotator delay before returning to step 750.

Another interesting case in which the phase rotators can be used to optimize clock alignment is at low data rates. If the data rate of the communication channel is decreased from the maximum rate by reducing the frequency of the refclk input to the clock generation unit 325 or the multiplication ratio is reduced, the 90-degree phase shift between I and Q clocks is preserved, and timing margin (and clock insertion delay) increases accordingly. However, in some embodiments, a programmable clock divider may be placed downstream of each I/Q divider. The programmable clock divider extends the range of data rates that are available to below the operating range of the clock multiplying PLL. The pair of clocks generated from each post-divider will be separated by 90°/N, where N is the division ratio of the post-divider and 90° is referenced to the divided clock rate. The extension of the available data rates may be desirable, as it fixes the clock insertion delay to that of the maximum data rate, instead of scaling up with the increasing bit period. If more timing margin is desired at the lower data rates (at the expense of clock insertion delay), the phase rotators can be used to delay the clock until the desired setup margin is achieved. Note that wire delay calibration will continue to work when post-dividers are used.

Redundancy and Continuous Measurement

In one embodiment, additional data wires and at least one additional clock wire may be included for one or more channels of the on-chip interconnect. The additional wires are redundant and may be used in place of a wire that does not meet the timing constraints, even after adjusting the delay of the wire is adjusted. To further improve chip yields, all of the available wires may be calibrated, including the redundant wires, and the set of wires that best satisfy the timing constraints may be selected to transmit the data signals of the on-chip interconnect.

The calibration pattern generation unit 310 and the calibration pattern capture unit 315 may be modified to allow for a redundant wire to be swapped for any other wire of each sub-channel. Inclusion of a 2:1 multiplexer enables a signal to be transmitted over one of two wires, allowing a sub-channel to use the best N of N+1 wires that are available. Yield is improved because data is not transmitted over non-functioning wires, or wires having the least amount of timing margin.

Figure 8A:
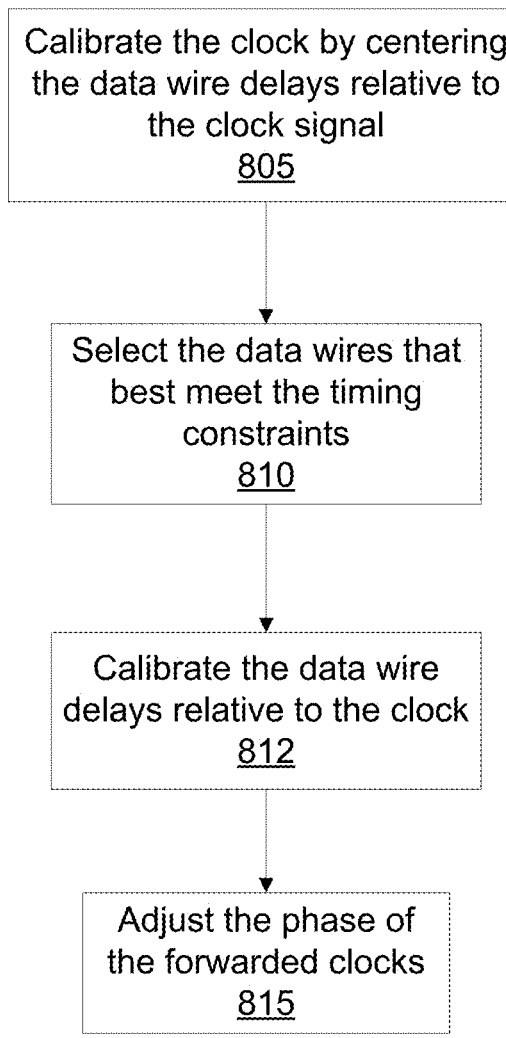
FIG. 8A is a flowchart illustrating a technique for calibrating on-chip interconnect with redundancy, according to one embodiment of the present disclosure.

FIG. 8A is a flowchart illustrating a technique for calibrating on-chip interconnect with redundancy, according to one embodiment of the present disclosure. Although the method steps are described in conjunction with the timing calibration system 300 of FIG. 3A, the clock generation unit 325 of FIG. 4A, the calibration pattern generation unit 310 of FIG. 4C, and the calibration pattern capture unit 315 of FIG. 4D, persons of ordinary skill in the art will understand that any system configured to perform the method steps, in any order, is within the scope of the disclosure.

At step 805 the forwarded clock signal for a sub-channel is calibrated using the technique described in conjunction with FIG. 5B, i.e., delays of the data wires are measured relative to each edge of the forwarded clock signal. At step 810 a set of wires is selected that best meets the timing constraints and the configurable delay circuit 100 that is in series with the forwarded clock signal is substantially centered within a distribution of the wire delays of the selected wires. Note that the selected wires may also include one or more redundant data wires.

At step 812 the data wire delays are calibrated relative to the clock signal (ClkI_data or ClkQ_data) using the techniques described in conjunction with FIG. 6. Finally, at step 815, the phase of the forwarded clock signals (ClkI_clk or ClkQ_clk) is adjusted using the techniques described in conjunction with FIG. 7.

Another use for the redundant wires is to perform timing margin characterization while a channel is operating. Redundant wires may be margined in noise environments when actual applications are executing on the chip. An additional clock switch unit 305 and may be included and used in conjunction with the existing calibration pattern generation unit 310, calibration pattern capture unit 315, and the calibration control unit 320 while the on-chip interconnect enabled to transmit signals during normal operation to characterize the redundant wires. The timing calibration system 200 is configured to sweep the phase of the forwarded clocks and data for the redundant wires while checking for errors in the calibration patterns received at the calibration pattern capture unit 315, the timing margin can be measured for each redundant wire during normal operation. When the phase rotator has high resolution, a "bathtub" curve of the bit error rate versus the phase offset can be generated by the calibration pattern capture unit 315, allowing measurement and extrapolation of timing margin to particular bit error rates.

Figure 8B:
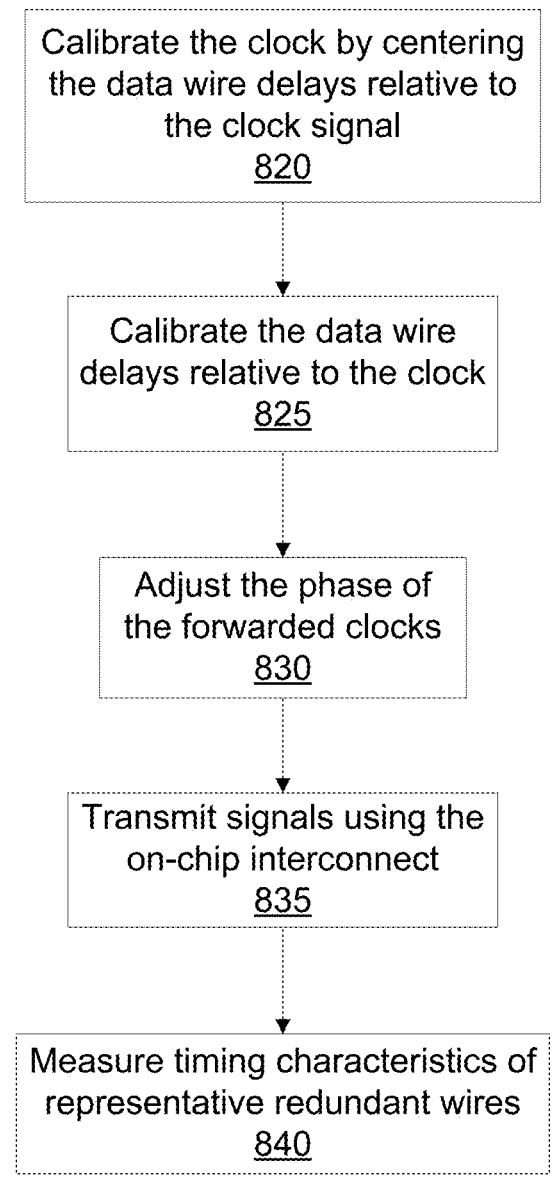
FIG. 8B is a flowchart illustrating a technique for dynamically measuring on-chip interconnect characteristics using representative redundant wires, according to one embodiment of the present disclosure.

FIG. 8B is a flowchart illustrating a technique for dynamically measuring on-chip interconnect characteristics during normal operation using representative redundant wires, according to one embodiment of the present disclosure. Although the method steps are described in conjunction with the timing calibration system 300 of FIG. 3A, the clock generation unit 325 of FIG. 4A, the calibration pattern generation unit 310 of FIG. 4C, and the calibration pattern capture unit 315 of FIG. 4D, persons of ordinary skill in the art will understand that any system configured to perform the method steps, in any order, is within the scope of the disclosure.

At step 820 the forwarded clock signal for a sub-channel is calibrated using the technique described in conjunction with FIG. 5B, i.e., delays of the data wires are measured relative to each edge of the forwarded clock signal and the configurable delay circuit 100 that is in series with the forwarded clock signal is substantially centered within a distribution of the wire delays. At step 825 the data wire delays are calibrated relative to the clock signal (ClkI_data or ClkQ_data) using the techniques described in conjunction with FIG. 6. At step 830, the phase of the forwarded clock signals (ClkI_clk or ClkQ_clk) is adjusted using the techniques described in conjunction with FIG. 7.

At step 820 data signals are transmitted on the data wires and the forwarded clock signals are transmitted on the clock wires for the channel of the on-chip interconnect. At step 825 the timing characteristics of the representative redundant wires are measured. The redundant wires are considered representative because they are routed in a similar manner to the wires of the channel. The timing characteristics of the representative redundant wires are measured by performing the steps described in conjunction with FIG. 6. The early and late flags may be determined for each representative redundant wire and the configurable delay circuit 100 may also be adjusted to perform the characterization.

System Overview

Figure 9:
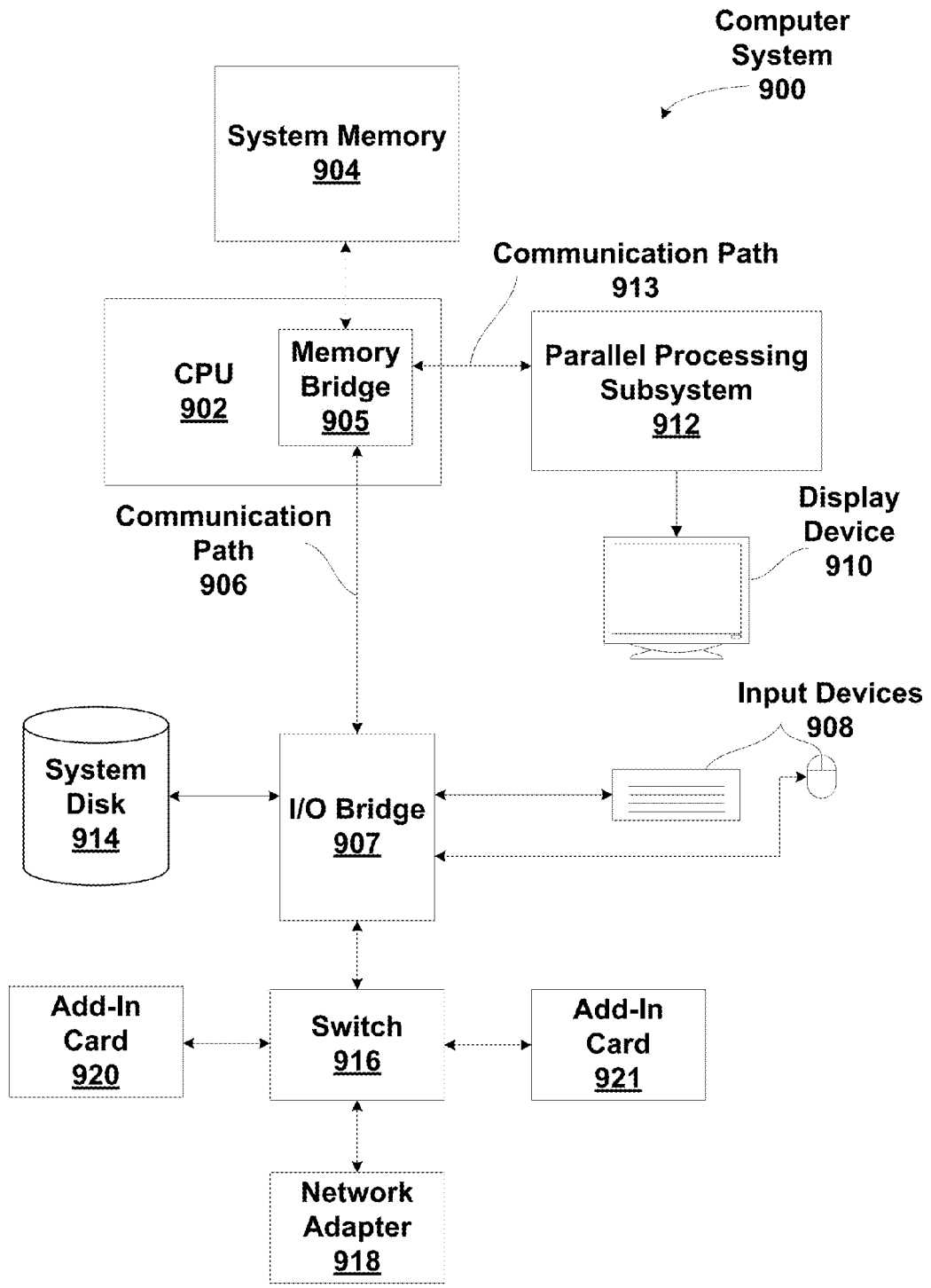
FIG. 9 is a block diagram illustrating a computer system configured to implement one or more aspects of the present invention.

FIG. 9 is a block diagram illustrating a computer system 900 configured to implement one or more aspects of the present invention. Computer system 900 includes a central processing unit (CPU) 902 and a system memory 904 communicating via an interconnection path that may include a memory bridge 905. Memory bridge 905, which may be, e.g., a Northbridge chip, is connected via a bus or other communication path 906 (e.g., a HyperTransport link) to an I/O (input/output) bridge 907. One or more of the devices shown in FIG. 3B may include the configurable delay circuit 100 to delay clock and/or data signals of an on-chip interconnect.

I/O bridge 907, which may be, e.g., a Southbridge chip, receives user input from one or more user input devices 908 (e.g., keyboard, mouse) and forwards the input to CPU 902 via communication path 906 and memory bridge 905. A parallel processing subsystem 912 is coupled to memory bridge 905 via a bus or second communication path 913 (e.g., a Peripheral Component Interconnect (PCI) Express, Accelerated Graphics Port, or HyperTransport link); in one embodiment parallel processing subsystem 912 is a graphics subsystem that delivers pixels to a display device 910 (e.g., a conventional cathode ray tube or liquid crystal display based monitor). A system disk 914 is also connected to I/O bridge 907. A switch 916 provides connections between I/O bridge 907 and other components such as a network adapter 918 and various add-in cards 920 and 921. Other components (not explicitly shown), including universal serial bus (USB) or other port connections, compact disc (CD) drives, digital video disc (DVD) drives, film recording devices, and the like, may also be connected to I/O bridge 907. The various communication paths shown in FIG. 3B, including the specifically named communication paths 906 and 913 may be implemented using any suitable protocols, such as PCI Express, AGP (Accelerated Graphics Port), HyperTransport, or any other bus or point-to-point communication protocol(s), and connections between different devices may use different protocols as is known in the art.

In one embodiment, the parallel processing subsystem 912 incorporates circuitry optimized for graphics and video processing, including, for example, video output circuitry, and constitutes a graphics processing unit (GPU). In another embodiment, the parallel processing subsystem 912 incorporates circuitry optimized for general purpose processing, while preserving the underlying computational architecture, described in greater detail herein. In yet another embodiment, the parallel processing subsystem 912 may be integrated with one or more other system elements in a single subsystem, such as joining the memory bridge 905, CPU 902, and I/O bridge 907 to form a system on chip (SoC).

It will be appreciated that the system shown herein is illustrative and that variations and modifications are possible. The connection topology, including the number and arrangement of bridges, the number of CPUs 902, and the number of parallel processing subsystems 912, may be modified as desired. For instance, in some embodiments, system memory 904 is connected to CPU 902 directly rather than through a bridge, and other devices communicate with system memory 904 via memory bridge 905 and CPU 902. In other alternative topologies, parallel processing subsystem 912 is connected to I/O bridge 907 or directly to CPU 902, rather than to memory bridge 905. In still other embodiments, I/O bridge 907 and memory bridge 905 might be integrated into a single chip instead of existing as one or more discrete devices. Large embodiments may include two or more CPUs 902 and two or more parallel processing systems 912. The particular components shown herein are optional; for instance, any number of add-in cards or peripheral devices might be supported. In some embodiments, switch 916 is eliminated, and network adapter 918 and add-in cards 920, 921 connect directly to I/O bridge 907.

In sum, a technique for satisfying timing requirements of on-chip source-synchronous, CMOS-repeater-based interconnect reduces timing mismatches between different wires comprising the on-chip interconnect. Calibration logic is configured to apply transition patterns to measure delays of individual on-chip data wires resulting from transistor and wire metallization differences. Based on the measurements, wires that best satisfy the timing requirements of the on-chip interconnect are selected. The delays of the selected on-chip data wires are individually adjusted to further reduce the timing mismatches. When the delay variations between the different data wires of the on-chip interconnect are reduced, the speed at which the on-chip interconnect may reliably operate is increased and chip yield is improved.

Advantageously, the disclosed technique of incorporating redundant wires into an on-chip interconnect reduces wire delay mismatches, which, in turn, helps improve overall chip yields. Additional redundant wires that are representative of the wires in the on-chip interconnect used to transmit data may be included in the on-chip interconnect. Delays associated with the additional redundant wires may be dynamically measured by the calibration logic while the on-chip interconnect is in use to characterize the on-chip interconnect.

One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

The invention has been described above with reference to specific embodiments. Persons skilled in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

Therefore, the scope of embodiments of the present invention is set forth in the claims that follow.

The invention claimed is:

1. A method for calibrating an on-chip interconnect, comprising:
   applying a first signal transition pattern that is a first binary pattern to a first wire of the on-chip interconnect that is coupled between a first transmitter and a first receiver to generate a plurality of first measurements that correspond to a timing characteristic of the first wire; and
   configuring, based on the plurality of first measurements, a delay circuit to adjust a delay of the first wire to fall within a range of a predetermined delay variation that is substantially centered on an edge of a clock signal.

2. The method of claim 1, further comprising applying a second signal transition pattern that is a second binary pattern to the first wire of the on-chip interconnect to generate a plurality of second measurements that correspond to the timing characteristic of the first wire, wherein the delay circuit is further configured, based on the plurality of second measurements, to adjust the delay of the first wire to fall within the range of the predetermined delay variation.

3. The method of claim 1, further comprising:
   determining a delay distribution associated with the first wire and other wires of the on-chip interconnect; and
   positioning the edge of the clock signal to substantially center the edge of the dock signal within the delay distribution.

4. The method of claim 1, wherein the plurality of first measurements indicates that a delay associated with the first wire is negative relative to the edge of the clock signal, and wherein the delay circuit is configured to increase the delay associated with the first wire.

5. The method of claim 1, wherein the plurality of first measurements indicates that a delay associated with the first wire is positive relative to the edge of the clock signal, and wherein the delay circuit is configured to decrease the delay associated with the first wire.

6. The method of claim 1, wherein the delay circuit is configured to increase or decrease a delay associated with the first wire by an amount equal to the range of the predetermined delay variation.

7. The method of claim 1, wherein the delay circuit is configured to increase or decrease a delay associated with the first wire by an amount equal to an integer multiple of the range of the predetermined delay variation.

8. The method of claim 1, wherein the range of the predetermined delay variation is associated with a target yield of a chip comprising the on-chip interconnect.

9. The method of claim 1, further comprising, after configuring, adjusting the clock signal to substantially center the edge of the clock signal between transitions of a signal transmitted on the first wire.

10. The method of claim 1, further comprising transmitting data on the first wire of the on-chip interconnect, and transmitting the clock signal on a second wire of the on-chip interconnect that is coupled between a second transmitter and a second receiver.

11. The method of claim 1, wherein the delay circuit is configured to delay rising edges of a data signal transmitted on the first wire by a first amount and delay falling edges of the data signal by a second amount.

12. The method of claim 1, further comprising configuring a second delay circuit to delay rising edges of the clock signal by a first amount and delay falling edges of the clock signal by a second amount.

13. An on-chip interconnect calibration system, comprising:
    a calibration pattern generation unit configured to generate a first signal transition pattern that is a first binary pattern;
    a calibration pattern capture unit configured to generate a plurality of first measurements that correspond to a timing characteristic of a first wire of the on-chip interconnect that is coupled between a first transmitter and a first receiver;
    a delay circuit that is coupled to the first wire of the on-chip interconnect; and
    a calibration control unit that is coupled to the calibration pattern generation unit and a calibration pattern capture unit and configured to:
        apply the first signal transition pattern to the first wire of the on-chip interconnect to generate the plurality of first measurements; and
        configure, based on the plurality of first measurements, the delay circuit to adjust a delay of the first wire to fall within a range of a predetermined delay variation that is substantially centered on an edge of a clock signal.

14. The on-chip interconnect calibration system of claim 13, wherein the calibration pattern generation unit is further configured to generate a second signal transition pattern that is a second binary pattern, the calibration pattern capture unit is further configured to generate a plurality of second measurements that correspond to the timing characteristic of the first wire, the calibration control unit is further configured to apply the second signal transition pattern to the first wire of the on-chip interconnect to generate the plurality of second measurements and, based on the plurality of second measurements, configure the delay circuit to adjust the delay of the first wire to fall within the range of the predetermined delay variation.

15. The on-chip interconnect calibration system of claim 13, further comprising a clock switch unit that is coupled to the calibration control unit and configured to generate the clock signal.

16. The on-chip interconnect calibration system of claim 13, further comprising a second delay unit that is coupled to a second wire that transmits the clock signal and is coupled between a second transmitter and a second receiver, wherein the calibration control unit configures the second delay unit to substantially center the edge of the clock signal within a delay distribution associated with the first wire and other wires of the on-chip interconnect.

17. The on-chip interconnect calibration system of claim 13, wherein the plurality of first measurements indicates that a delay of the first wire is negative relative to the edge of the clock signal and the delay circuit is configured by the calibration control unit to increase the delay associated with the first wire.

18. The on-chip interconnect calibration system of claim 13, wherein the plurality of first measurements indicates that a delay of the first wire is positive relative to the edge of the clock signal and the delay circuit is configured by the calibration control unit to decrease the delay associated with the first wire.

19. The on-chip interconnect calibration system of claim 13, wherein the delay circuit is configured by the calibration control unit to increase or decrease a delay associated with the first wire by an amount equal to the range of the predetermined delay variation.

20. The on-chip interconnect calibration system of claim 13, wherein the range of the predetermined delay variation is associated with a target yield of a chip comprising the on-chip interconnect.

21. The on-chip interconnect calibration system of claim 13, further comprising a second delay unit that is coupled to a second wire between a second transmitter and a second receiver that transmits the clock signal, the second delay unit, further configured by the calibration control unit to adjust the clock signal to substantially center the edge of the clock signal between transitions of a data signal transmitted on the first wire.

22. A computing system, comprising:
    an on-chip interconnect calibration system, comprising:
        a calibration pattern generation unit configured to generate a first signal transition pattern that is a first binary pattern;
        a calibration pattern capture unit configured to generate a plurality of first measurements that correspond to a timing characteristic of a first wire of the on-chip interconnect that is coupled between a first transmitter and a first receiver;
        a delay circuit that is coupled to the first wire of the on-chip interconnect; and
        a calibration control unit that is coupled to the calibration pattern generation unit and the calibration pattern capture unit and configured to:
            apply the first signal transition pattern to the first wire of the on-chip interconnect to generate the plurality of first measurements; and
            configure, based on the plurality of first measurements, the delay circuit to adjust a delay of the first wire to fall within a range of a predetermined delay variation that is substantially centered on an edge of a clock signal.

* * * * *